(12) United States Patent
Tsai et al.

(10) Patent No.: US 11,226,362 B2
(45) Date of Patent: Jan. 18, 2022

(54) SYSTEM-LEVEL TESTING APPARATUS AND SYSTEM-LEVEL TESTING SYSTEM

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

( * ) Notice: Subject to any disclaimer, the term of this patent is extended or adjusted under 35 U.S.C. 154(b) by 0 days.

(21) Appl. No.: 17/106,185

(22) Filed: Nov. 30, 2020

(65) Prior Publication Data

US 2021/0311107 A1 Oct. 7, 2021

(30) Foreign Application Priority Data

Apr. 1, 2020 (TW) ................................ 109111372

(51) Int. Cl.
*G01R 31/28* (2006.01)
*G01R 1/073* (2006.01)

(52) U.S. Cl.
CPC ......... *G01R 31/2808* (2013.01); *G01R 1/073* (2013.01)

(58) Field of Classification Search
CPC ............................ G01R 31/2808; G01R 1/073
USPC .................................................... 324/750.14
See application file for complete search history.

(56) References Cited

U.S. PATENT DOCUMENTS

2007/0007983 A1* 1/2007 Salmon .............. G01R 31/2886
324/750.08

FOREIGN PATENT DOCUMENTS

| CN | 200972482 Y | 11/2007 |
| TW | 201730572 A | 9/2017 |

* cited by examiner

*Primary Examiner* — Farhana A Hoque
(74) *Attorney, Agent, or Firm* — Li & Cai Intellectual Property Office

(57) ABSTRACT

A system-level testing apparatus and a system-level testing system are provided. The system-level testing apparatus includes an apparatus body, a chip carrying device, and a control device. A holding structure in the apparatus body is configured to hold a system circuit board. The chip carrying device includes a carrying circuit board, and a plurality of electrical connection sockets and a plurality of connection structures are disposed on the carrying circuit board. The electrical connection structures are electrically connected to the connection structures. When the electrical connection sockets carry a plurality of chips under test, the carrying circuit board is disposed on the system circuit board, and the connection structures are connected to a plurality of system connection structures of the system circuit board, the control device can transmit a test signal to perform a system-level test operation to the system circuit board and the chips under test.

20 Claims, 25 Drawing Sheets

SYSTEM-LEVEL TESTING APPARATUS AND SYSTEM-LEVEL TESTING SYSTEM

CROSS-REFERENCE TO RELATED PATENT APPLICATION

This application claims the benefit of priority to Taiwan Patent Application No. 109111372, filed on Apr. 1, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing apparatus and a testing system, and more particularly to a system-level testing apparatus and a system-level testing system.

BACKGROUND OF THE DISCLOSURE

Generally, in a conventional system-level testing apparatus, a plurality of chips under test are mounted onto a system circuit board in a manual manner, and after the chips under test and the system circuit board under test are provided with electricity and transmit a signal, it is manually determined whether the chips under test work normally. Finally, the chips under test are detached and disposed at a corresponding classification region in a manual manner.

A vendor of the conventional system-level testing apparatus customizes different system circuit boards according to different customer's requirements, and disposes different quantity of electrical connection sockets onto the system circuit boards according to customer's requirements. The vendor of the conventional system-level testing apparatus produces various types of different system circuit boards according to different circuit board designs of the system circuit boards from different customers. Therefore, most of the system circuit boards of different customers cannot be shared, however most of the related electrical connection sockets disposed on the system circuit boards can be shared. It takes a lot of time and cost for the vendor of the system-level testing apparatus to detach the electrical connection sockets from the system circuit boards, thereby increasing the overall testing time and cost. This leads to waste because the vendor of the conventional system-level testing apparatus does not detach and reuse the electrical connection sockets.

SUMMARY OF THE DISCLOSURE

In response to the above-referenced technical inadequacies, the present disclosure provides a system-level testing apparatus and a system-level testing system to improve the issues associated with a conventional system-level testing apparatus (e.g., a vendor of the conventional system-level testing apparatus producing different system circuit boards according to different customer's requirements, the electrical connection sockets on the system circuit board are generally welded and fixed onto the system circuit board, and accordingly, even if different customers need the same electrical connection sockets, the vendor of the conventional system-level testing apparatus cannot easily reuse the electrical connection sockets when producing the system circuit boards).

In one aspect, the present disclosure provides a system-level testing apparatus configured to perform a system-level test operation to a plurality of chips under test and connected to a power supply apparatus, and the system-level testing apparatus includes an apparatus body, a holding structure, a chip carrying device, and a control device. The apparatus body includes at least one accommodating chamber. The holding structure is disposed on the apparatus body, the holding structure is arranged in the at least one accommodating chamber, and the holding structure is configured to hold a system circuit board. The chip carrying device is movably disposed on a connection surface of the system circuit board held by the holding device, and the chip carrying device includes a carrying circuit board, a plurality of electrical connection sockets, and a plurality of connection structures. The carrying circuit board has a first board surface and a second board surface respectively defined by two opposite sides of the carrying circuit board. The electrical connection sockets are disposed on the first board surface, and each of the electrical connection sockets is configured to carry one of the chips under test. The connection structures are disposed on the first board surface or the second board surface, and the connection structures are electrically connected to the electrical connection sockets. The connection structures are configured to be connected to a plurality of system connection structures disposed on the connection surface of the system circuit board. The control device is electrically connected to the chip carrying device. When the chip carrying device is disposed in the at least one accommodating chamber and at least one of the electrical connection sockets of the chip carrying device carries at least one of the chips under test, the system circuit board is held by the holding structure, and the connection structures are connected to the system connection structures. When the system-level testing apparatus is provided with electricity by the power supply apparatus, the at least one of the chips under test carried by at least one of the electrical connection sockets is electrically connected to the system circuit board through the at least one of electrical connection sockets, at least one of the connection structures, and at least one of the system connection structures. The control device is configured to transmit at least one test signal to the chip carrying device to test whether the at least one of the chips under test carried by the at least one of the electrical connection sockets normally works after the at least one of the chips under test is electrically connected to the system circuit board.

In one aspect, the present disclosure provides a system-level testing system configured to perform a system-level test operation to a plurality of chips under test and connected to a power supply apparatus, and the system-level testing system includes a central control device, a plurality of system-level testing apparatuses, a plurality of chip carrying devices, a chip mounting apparatus, and a transferring apparatus. Each of the system-level testing apparatuses is electrically connected to the central control device, and each of the system-level testing apparatuses includes an apparatus body, and a holding structure. The apparatus body includes at least one accommodating chamber. The holding structure is disposed on the apparatus body. The holding structure is arranged in the at least one accommodating chamber and is configured to hold a system circuit board. Each of the chip carrying devices includes a carrying circuit board, a plurality of electrical connection sockets, and a plurality of connection structures. The carrying circuit board has a first board surface and a second board surface respectively defined by two opposite sides of the carrying circuit board. The electrical connection sockets are disposed on the first board surface, and each of the electrical connection sockets is configured to carry one of the chips under test. The connection structures are disposed on the first board surface or the second board surface. The connection structures are electrically connected to the electrical connection sockets. The connection structures are configured to be connected to a plurality of system connection structures disposed on a connection surface of the system circuit board. The chip mounting apparatus is electrically connected to the central control device. The central control device is configured to control the chip mounting apparatus to mount the chips under test onto the electrical connection sockets. The transferring apparatus is electrically connected to the central control device. The central control device is configured to control the transferring device to move one of the system circuit boards into or out of the at least one accommodating chamber. The central control device is configured to control the transferring device to move one of the chip carrying devices into or out of the at least one accommodating chamber. When the chip carrying device is disposed in the at least one accommodating chamber and at least one of the electrical connection sockets of the chip carrying device carries at least one of the chips under test, the system circuit board is held by the holding structure, and the connection structures are connected to the system connection structures. When the system-level testing apparatus is provided with electricity by the power supply apparatus, the at least one of the chips under test carried by at least one of the electrical connection sockets is electrically connected to the system circuit board through the at least one of electrical connection sockets, at least one of the connection structures, and at least one of the system connection structures. The central control device is configured to transmit at least one test signal to the chip carrying device to test whether the at least one of the chips under test carried by the at least one of the electrical connection sockets normally works after the at least one of the chips under test is electrically connected to the system circuit board.

Therefore, the system-level testing apparatus and the system-level testing system of the present disclosure take advantage of the design of the holding structure and the chip carrying device to enable users to easily change different system circuit board under test and reuse the same electrical connection sockets.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
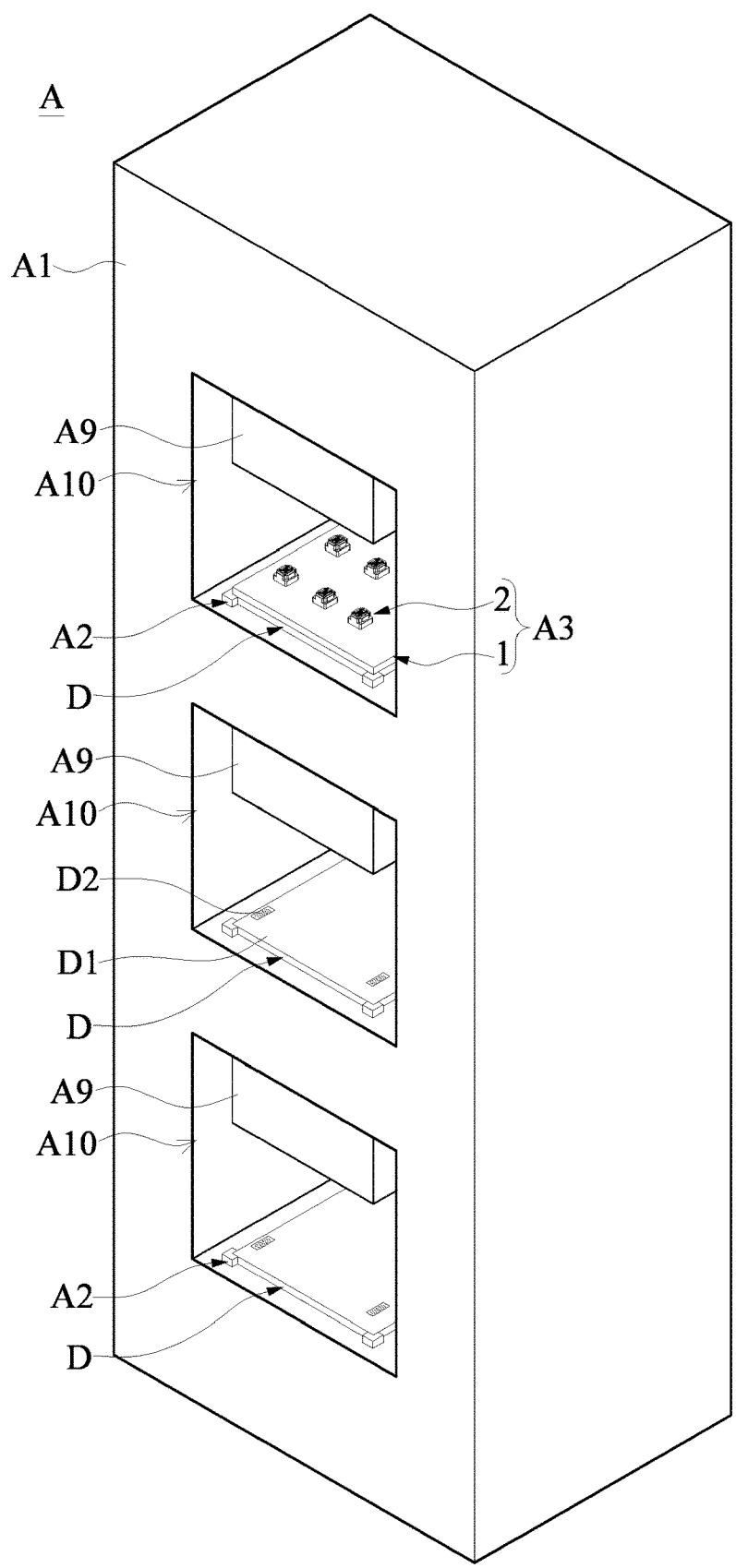
FIG. 1 is a schematic view of a system-level testing apparatus of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
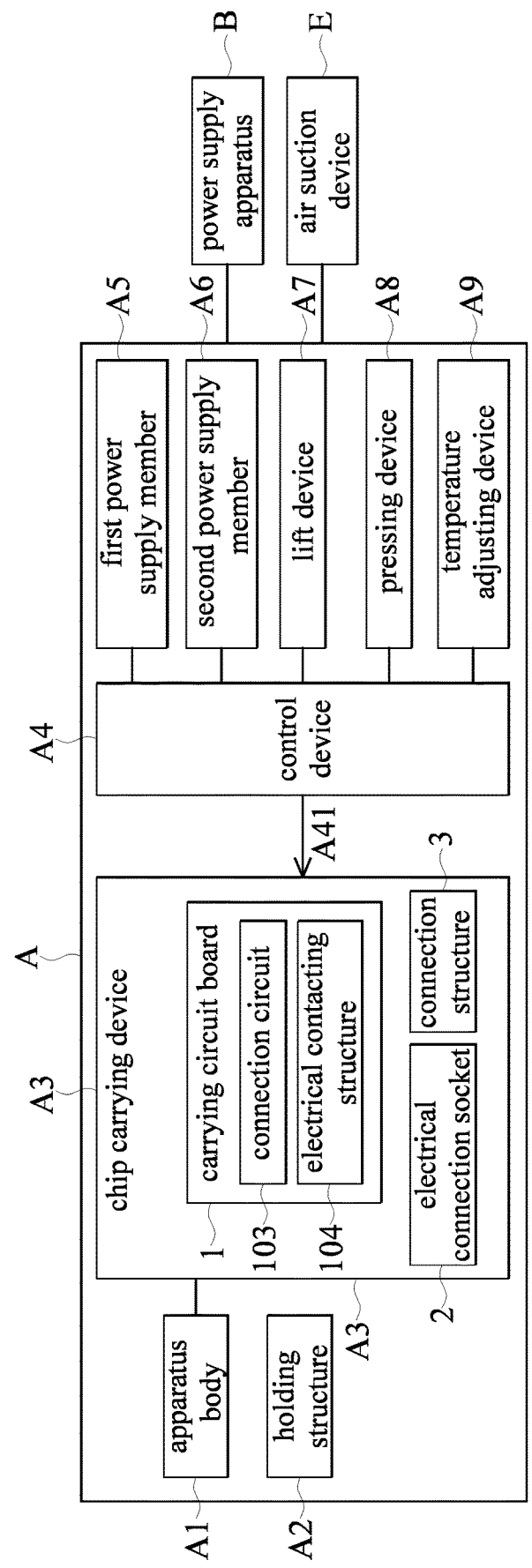
FIG. 2 is a block diagram of the system-level testing apparatus of the present disclosure.

Referring to FIG. 1 and FIG. 2, FIG. 1 is a schematic view of a system-level testing apparatus of the present disclosure, and FIG. 2 is a block diagram of the system-level testing apparatus of the present disclosure. The system-level testing apparatus A of the present disclosure includes an apparatus body A1, a holding structure A2, a chip carrying device A3, and a control device A4. The system-level testing apparatus A is connected to a power supply apparatus B. The power supply apparatus B can provide electricity for the system-level testing apparatus A for operation. The power supply apparatus B can be connected to mains. The system-level testing apparatus A of the present disclosure is configured to perform a system-level test (SLT) operation to a plurality of chips under test C connected to a system circuit board D. In other words, after the chips under test C are connected to the system circuit board D, the system-level testing apparatus A is configured to test whether each of the chips under test C normally works.

Generally, before an electronic product is mass assembled and produced, it substantially undergoes a two-stage test. The first stage test of the two-stage test is implemented by individually performing various electrical tests (i.e., ATE test) to each of the integrated circuits (i.e., IC) of the electronic product. If each of the integrated circuits passes the first stage test, a second stage test of the two-stage test is implemented. In the second stage test, the integrated circuits passing the first stage test are assembled into the electronic product or a state similar to the electronic product by related personnel or machines, and the electronic product is provided with electricity so that the electronic product is tested to see whether the integrated circuits work normally (i.e., SLT test). Only if the electronic product passes the second stage test, do the related personnel allow the electronic product to be mass produced. The system-level testing apparatus A of the present disclosure is primarily provided to perform the second stage test (i.e., the SLT test).

Referring to FIG. 1, in a practical application, the apparatus body A1 can include a plurality of accommodating chambers A10, and each of the accommodating chambers A10 can be in spatial communication with each other. Each of the accommodating chambers A10 can also be not in spatial communication with each other, and the present disclosure is not limited thereto. The system-level testing apparatus A can include the holding structures A2, each of the accommodating chambers A10 is provided with one of the holding structures A2 disposed therein, and the holding structures A2 are configured to hold the system circuit board D. In a practical application, the holding structures A2 can be electrically connected to the control device A4, and the control device A4 can control the holding structures A2 so that the corresponding one of the holding structures A2 can hold the system circuit board D disposed in the corresponding one of the accommodating chambers A10. The control device A4 can control the holding structures A2 so that the corresponding one of the holding structures A2 does not hold the system circuit board D. When the corresponding one of the holding structures A2 does not hold the system circuit board D, the system circuit board D can be taken out by related personnel or a machine. Each of the holding structures A2 can be a manual structure, and related personnel manually operates the corresponding one of the holding structures A2 so that the corresponding one of the holding structures A2 can hold the system circuit board D.

A structure, a size, and a holding manner of the holding structures A2 can be designed according to a structure and a size of the system circuit board D and the accommodating chambers A10, and the present disclosure is not limited thereto. Any structure that can hold the system circuit board D in one of the accommodating chambers A10 is in the applicable scope of the present embodiment. In one embodiment of the present disclosure, the holding structures A2 can take advantage of a suction manner so that the system circuit board D tightly abuts against a side wall of the corresponding one of the accommodating chambers A10.

Referring to FIG. 1, when the corresponding one of the holding structures A2 holds the system circuit board D in the corresponding one of the accommodating chambers A10, a connection surface D1 of the system circuit board D is exposed from the corresponding one of the accommodating chambers A10 of the apparatus body A1. A plurality of system connection structures D2 are disposed on the connection surface D1 of the system circuit board D, and the system connection structures D2 can be a plurality of metal terminals formed on the connection surface D1 of the system circuit board D. It should be noted that, the system circuit board D shown in FIG. 1 is only one embodiment of the present disclosure. In a practical application, in addition to the system connection structures D2, the system circuit board D can be provided with other electronic components disposed thereon, such as various types of microprocessors, resistors, and capacitors, and the present disclosure is not limited thereto.

Referring to FIG. 2, the control device A4 is electrically connected to the chip carrying device A3, and the control device A4 can transmit at least one test signal A41 to the chip carrying device A3 or the system circuit board D to perform a system-level test operation to a plurality of chips under test C carried by the chip carrying device A3 that is connected to the system circuit board D. The control device A4 can be various types of computers or servers, and the present disclosure is not limited thereto. In a practical application, the control device A4 can control the power supply apparatus B to provide electricity to the chip carrying device A3 or the system circuit board D.

In a practical application, the control device A4 can be electrically connected to the system circuit board D through various types of transmission lines, metal terminals or in a wireless manner to transmit the test signal A41 to the system circuit board D through various types of transmission lines, metal terminals or in a wireless manner. Specifically, the apparatus body A1 can have a plurality of metal terminals disposed at a position that is configured to carry the system circuit board D, and when the system circuit board D is disposed in the apparatus body A1, the corresponding metal terminals of the system circuit board D can be connected to the metal terminals of the apparatus body A1, so that control device A4 can transmit the test signal A41 to the system circuit board D through the metal terminals of apparatus body A1 and the metal terminals of the system circuit board D, or the control device A4 can have a transmission line, the transmission line having a connector disposed at one end thereof, and the connector can be mated with corresponding socket of the system circuit board D. Therefore, the control device A4 can transmit the test signal A41 to the system circuit board D through the transmission line, the connector, and the socket.

Figure 3:
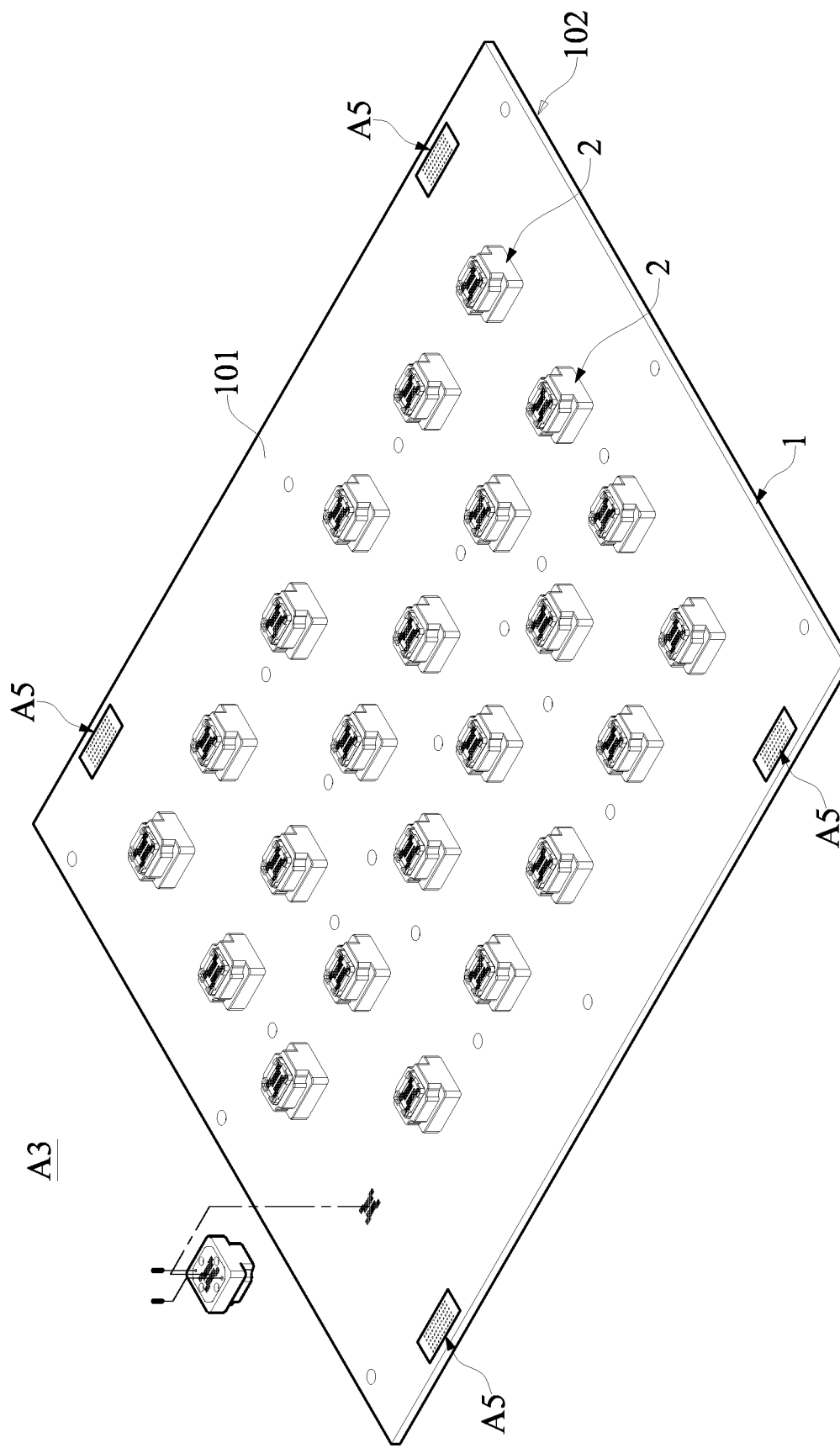
FIG. 3 is a schematic view of a chip carrying device of the system-level testing apparatus according to an embodiment of the present disclosure.

Referring to FIG. 1 to FIG. 3, FIG. 3 is a schematic view of a chip carrying device of the system-level testing apparatus according to an embodiment of the present disclosure. The chip carrying device A3 includes a carrying circuit board 1, a plurality of electrical connection sockets 2, and a plurality of connection structures 3. The carrying circuit board 1 has a first board surface 101 and a second board surface 102 respectively defined by two opposite sides of the carrying circuit board 1. The electrical connection sockets 2 are disposed on the first board surface 101 of the carrying circuit board 1. The connection structures 3 are disposed on the second board surface 102 of the carrying circuit board 1. The connection structures 3 are electrically connected to the electrical connection sockets 2, and each of the connection structures 3 is configured to be in contact with the system connection structures D2 of the system circuit board D. The carrying circuit board 1 has a connection circuit 103 inside of the carrying circuit board 1, and the connection circuit 103 is configured to enable the electrical connection sockets 2 to be electrically connected to the connection structures 3. In a practical application, the connection circuit 103 and the connection structures 3 can be formed by a plurality of conductive materials that are filled into a plurality of thru-holes of the carrying circuit board 1. In other words, the carrying circuit board 1 includes the thru-holes penetrating through the carrying circuit board 1, the thru-holes are filled with the conductive materials, and the conductive materials correspondingly form the connection structures 3 on the second board surface 102 of the carrying circuit board 1. The connection circuit 103 mentioned herein is primarily used to enable the connection structures 3 to be electrically connected to the electrical connection sockets 2. Therefore, a specific formation manner and a specific structure of the connection circuit 103 can be changed according to practical requirements, and the present disclosure is not limited thereto.

Figure 7:
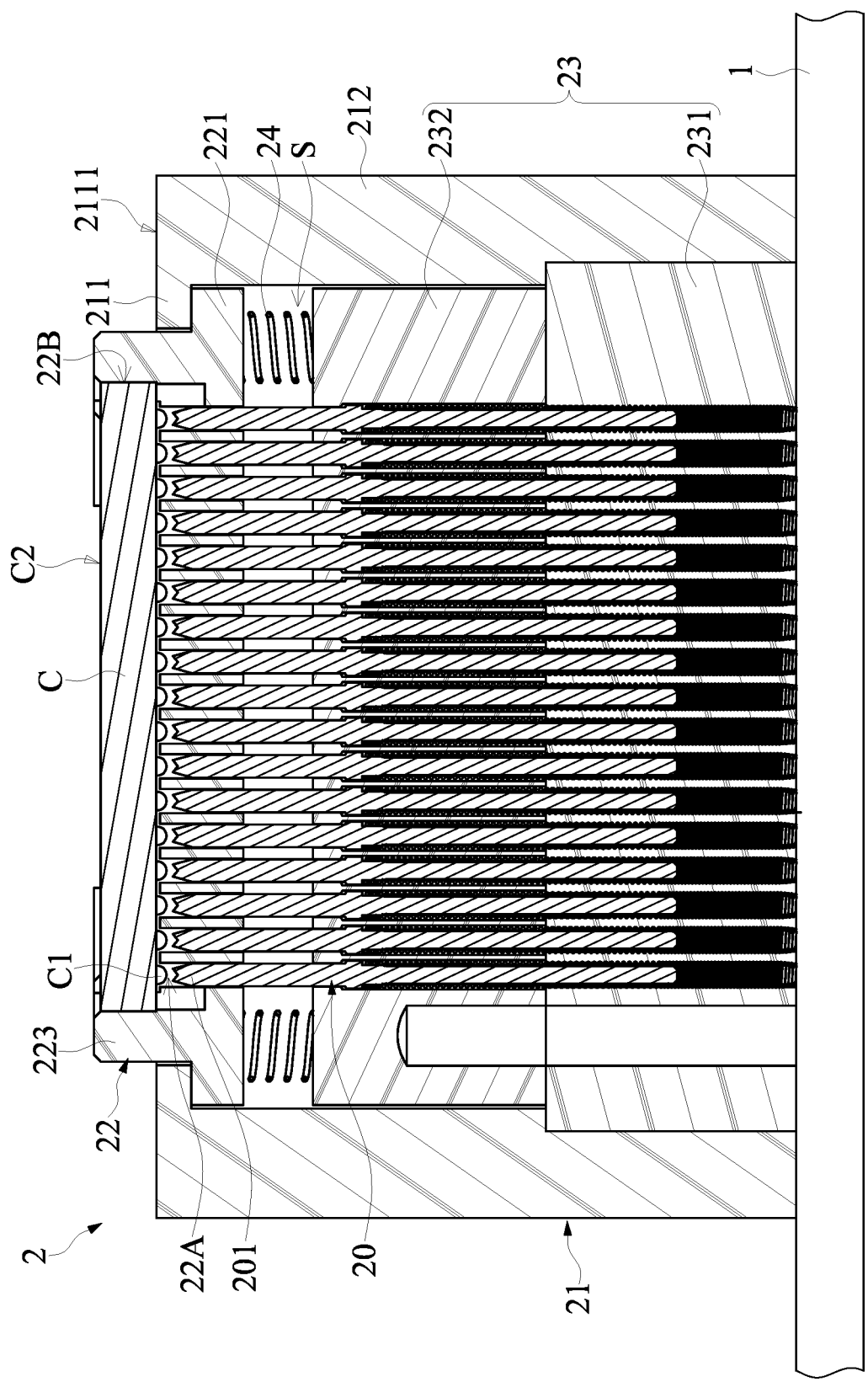
FIG. 7 is a sectional view of the electrical connection socket carrying the chip under test of the system-level testing apparatus of the present disclosure.

When the carrying circuit board 1 is transferred manually or through a related machine or apparatus to be disposed on the connection surface D1 of the system circuit board D that is held by the corresponding one of the holding structures A2, the connection structures 3 can be correspondingly in contact with the system connection structure D2 on the connection surface D1, and the chips under test C (as shown in FIG. 7) carried by the electrical connection sockets 2 can be electrically connected to the system circuit board D through the electrical connection sockets 2, the connection circuit 103, the connection structures 3, and the system connection structures 2.

When at least one of the electrical connection sockets 2 carries at least one of the chips under test C, the carrying circuit board 1 is disposed on the system circuit board D held by one of the holding structures A2, the connection structures 3 are in contact with the system connection structures D2, and the power supply apparatus B provides electricity to the system-level testing apparatus A, at least one of the chips under test C carried by at least one of the electrical connection sockets 2 can be electrically connected to the system circuit board D through at least one of the electrical connection sockets 2, at least one of the connection structures 3, the connection circuit 103, and at least one of the system connection structures D2, and the control device A4 can transmit at least one test signal A41 to chip carrying device A3 or the system circuit board D to test whether at least one of the chips under test C carried by at least one of the electrical connection sockets 2 normally works after at least one of the electrical connection sockets 2 is electrically connected to the system circuit board D (i.e., the system-level test operation).

Referring to FIG. 2 and FIG. 3, in a practical application, the system-level testing apparatus A can further include at least one first power supply member A5 and at least one second power supply member A6. The first power supply member A5 is disposed on the first board surface 101 of the carrying circuit board 1. The second power supply member A6 is disposed on the apparatus body A1. When the system circuit board D is held by the corresponding one of the holding structures A2 in the corresponding one of the accommodating chambers A10, and the carrying circuit board 1 carrying the chips under test C is disposed on the connection surface D1 of the system circuit board D, the power supply apparatus B can provide electricity to each of the chips under test C and the system circuit board D for operation through the second power supply member A6 and the first power supply member A5. In a practical application, the control device A4 can include related electronic components that are configured to convert voltage and adjust current, and the control device A4 can convert the electricity provided by the power supply apparatus B so that the voltage and current are suitable for the system circuit board D and the chips under test C, and the converted electricity is transmitted to the system circuit board D and the chips under test C through the first power supply members A5 and the second power supply members A6 (i.e., the quantity of the first power supply member A5 and the second power supply member A6 can be more than one).

In a practical application, each of the first power supply members A5 can include a plurality of connection terminals that can be a plurality of metal terminals formed on the first board surface 101 of the carrying circuit board 1. Each of the second power supply members A6 can similarly include a plurality of metal terminals, and each of the second power supply members A6 can be disposed on a related circuit board of the apparatus body A1. The quantity, configuration, and structure of the first power supply members A5 and the second power supply members A6 are not limited to those shown in FIG. 3. The positions where the first power supply members A5 are disposed on the carrying circuit board 1 are not limited to those shown in FIG. 3. In other embodiments, each of the first power supply members A5 can be a receiving antenna, each of the second power supply members A6 can be a transmitting antenna, and the receiving antennas are configured to be coupled with the transmitting antennas. The power supply member B can provide each of the chips under test C and the system circuit board D with electricity for operation through the first power supply members A5 and the second power supply members A6 in a wireless manner.

Referring to FIG. 3, in an embodiment of the present disclosure, electricity is provided to each of the chips under test C and the system circuit board D for operation through the first power supply members A5 and the second power supply members A6, and the system-level testing apparatus A can further include a lift device A7. The control device A4 is electrically connected to the lift device A7, and the control device A4 can control the lift device A7 so that the first power supply members A5 disposed on the carrying circuit board 1 are in contact with the second power supply members A6 disposed on the apparatus body A1. Therefore, the chips under test C and the system circuit board D can receive electricity. In a practical application, the system circuit board D can be disposed on the lift device A7, and when the control device A4 controls the lift device A7 to be operated, the lift device A7 moves the system circuit board D and the carrying circuit board 1 together toward the second power supply members A6 until the first power supply members A5 disposed on the carrying circuit board 1 are in contact with the second power supply members A6. In other embodiments, the second power supply members A6 can be connected to the lift device A7, and the control device A4 can control the lift device A7 so that the second power supply members A6 and the circuit board connected to the second power supply members A6 move toward the first power supply members A5 of the carrying circuit board 1 disposed on the system circuit board D until the second power supply members A6 are in contact with the first power supply members A5.

It should be noted that in a process where the control device A4 performs the system-level test operation to the chips under test C carried by the electrical connection sockets 2, the chips under test C can receive electricity for operation directly through the system circuit board D, and the way that the chips under test C receive the electricity for operation through can be changed according to practical requirements.

Figure 4:
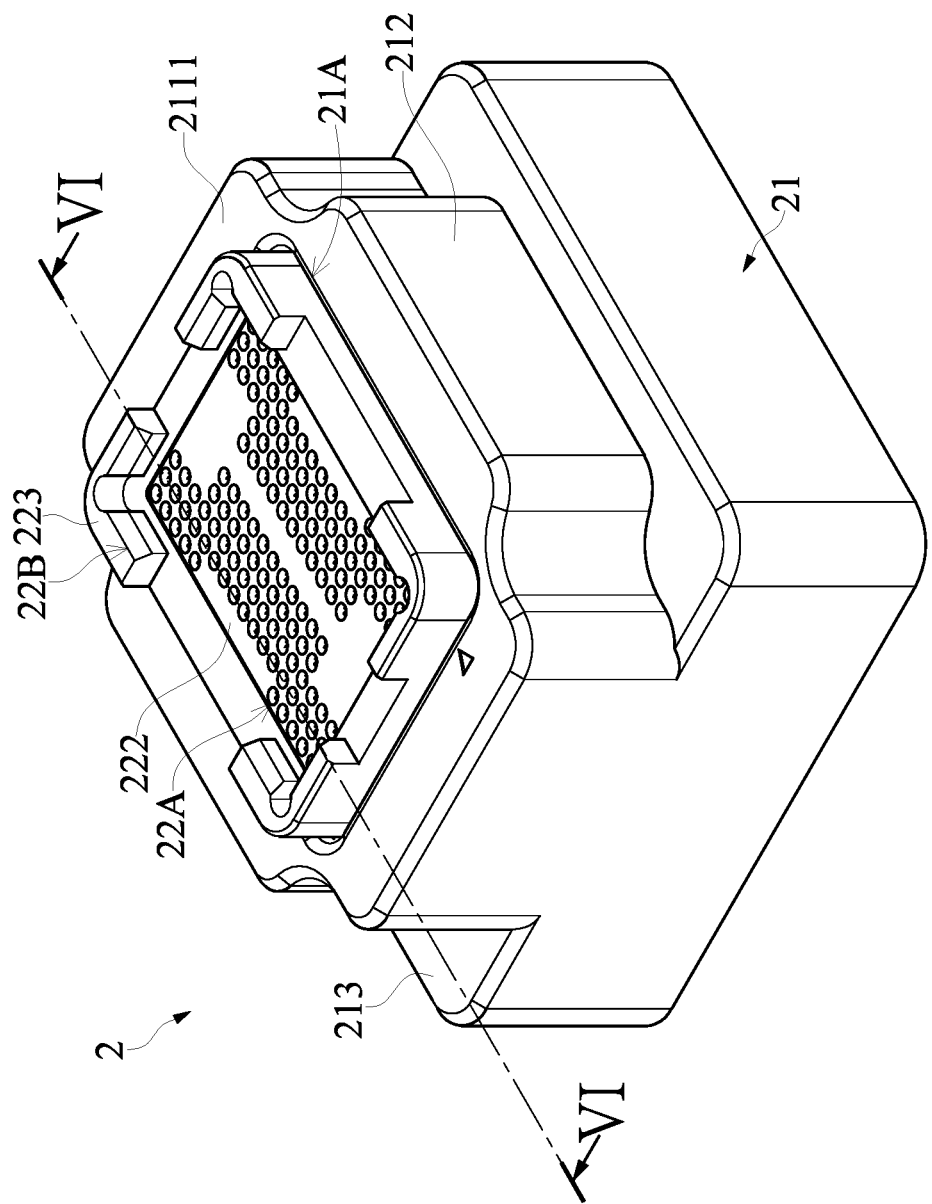
FIG. 4 is a schematic view of an electrical connection socket of the system-level testing apparatus according to an embodiment of the present disclosure.
Figure 5:
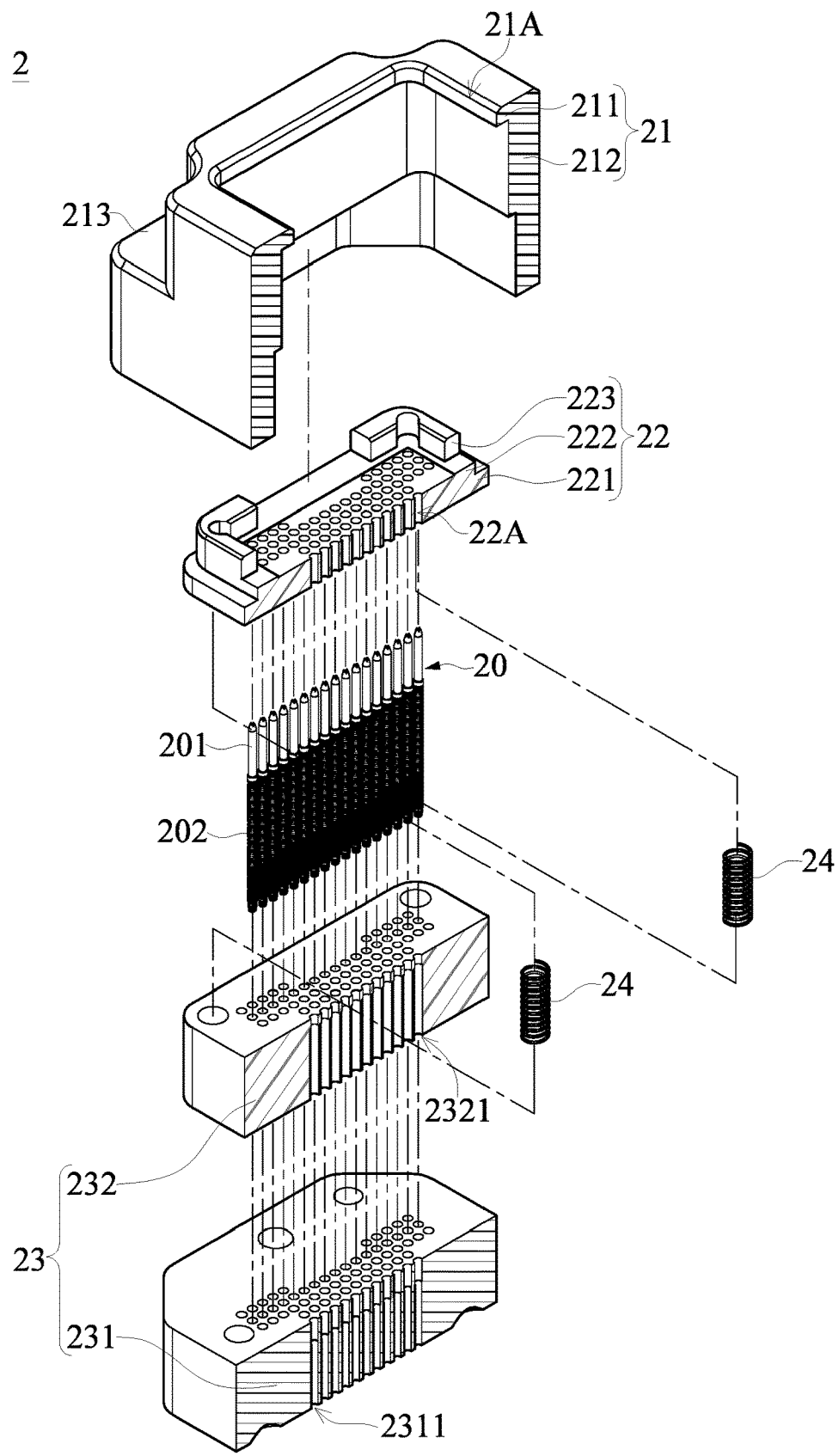
FIG. 5 is a sectional exploded view of the electrical connection socket of the system-level testing apparatus of the present disclosure.
Figure 6:
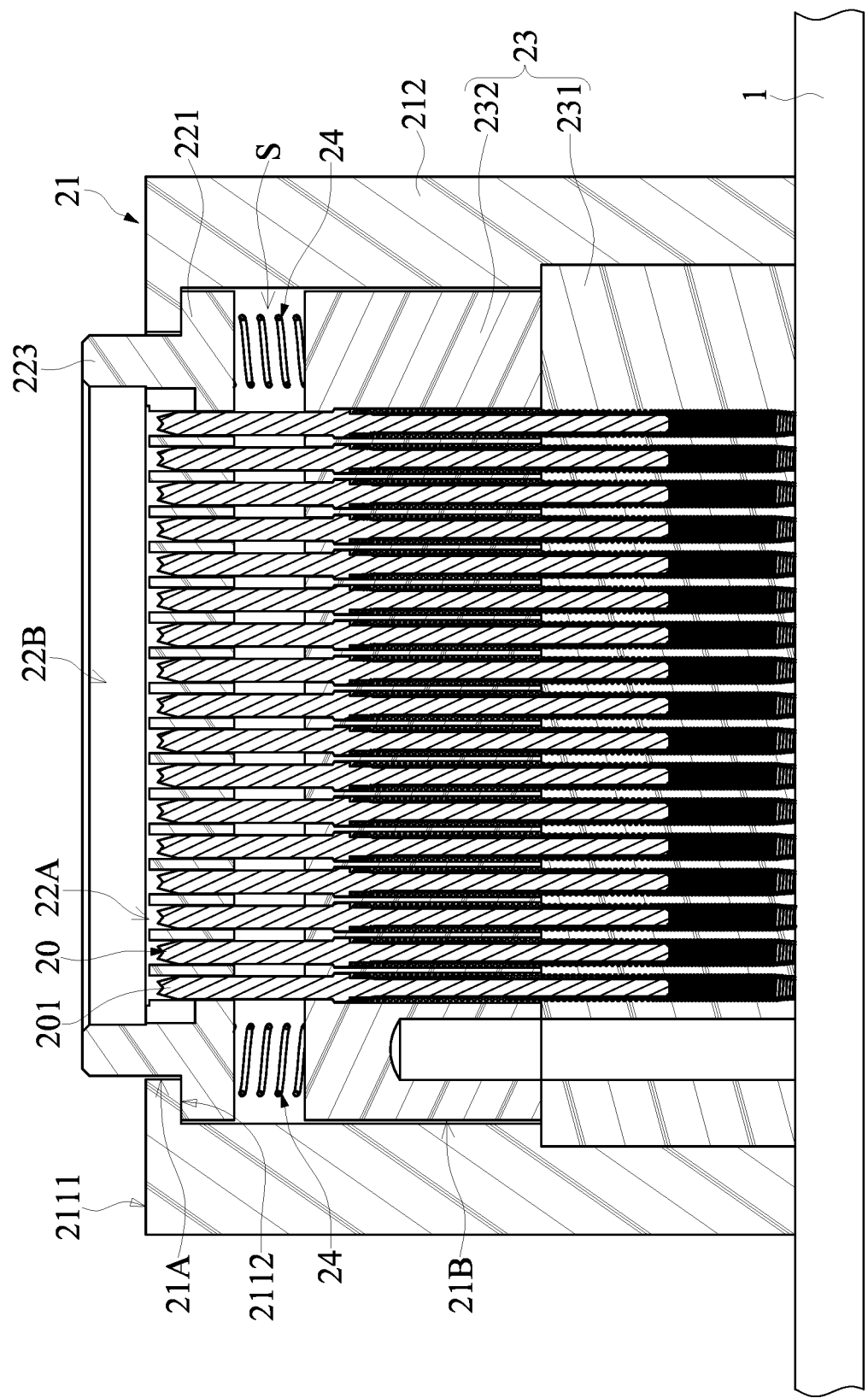
FIG. 6 is a sectional view of the electrical connection socket without carrying a chip under test of the system-level testing apparatus of the present disclosure.
Figure 8:
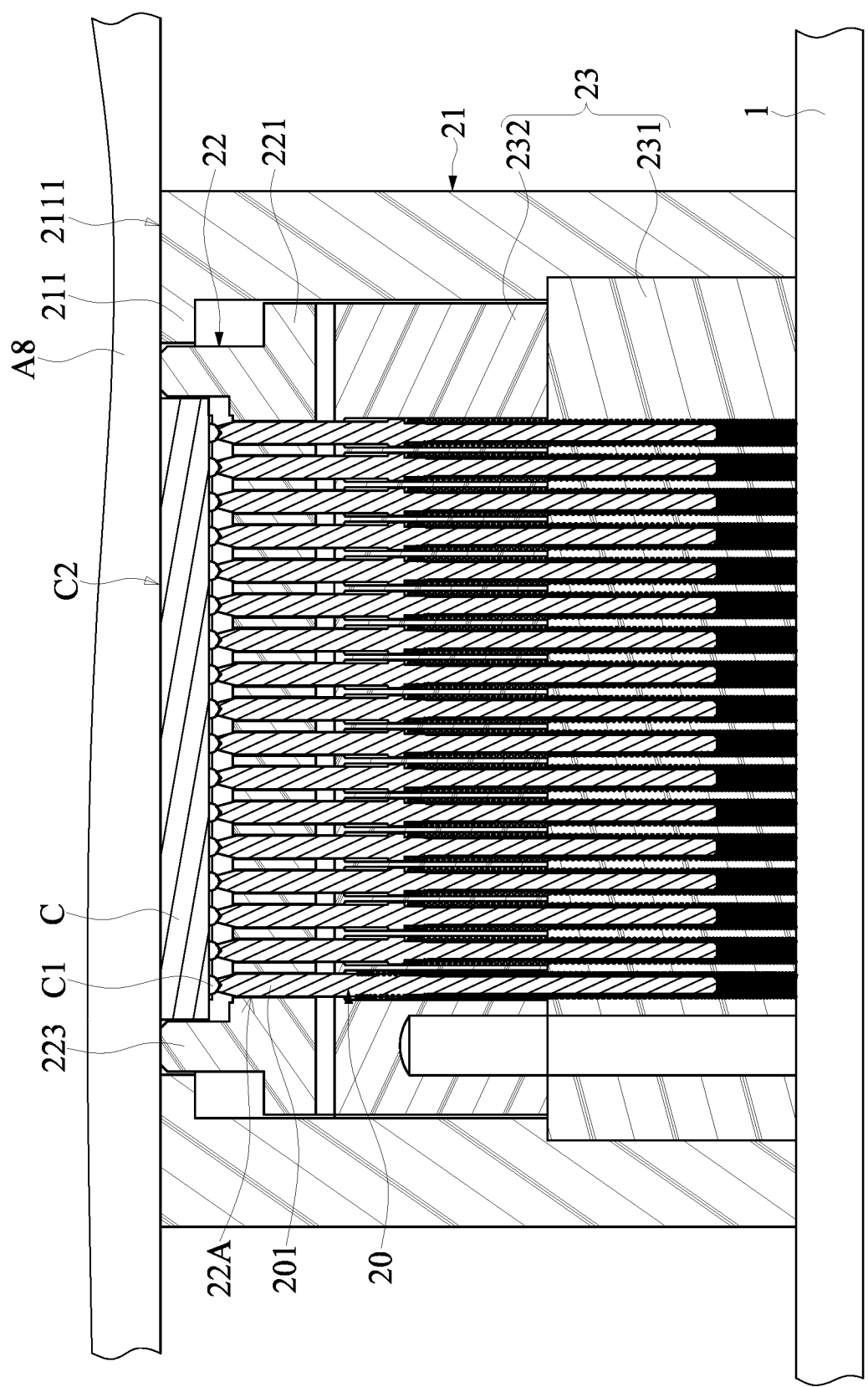
FIG. 8 is a sectional view of the electrical connection socket carrying the chip under test and pressed by a pressing device of the system-level testing apparatus.
Figure 9:
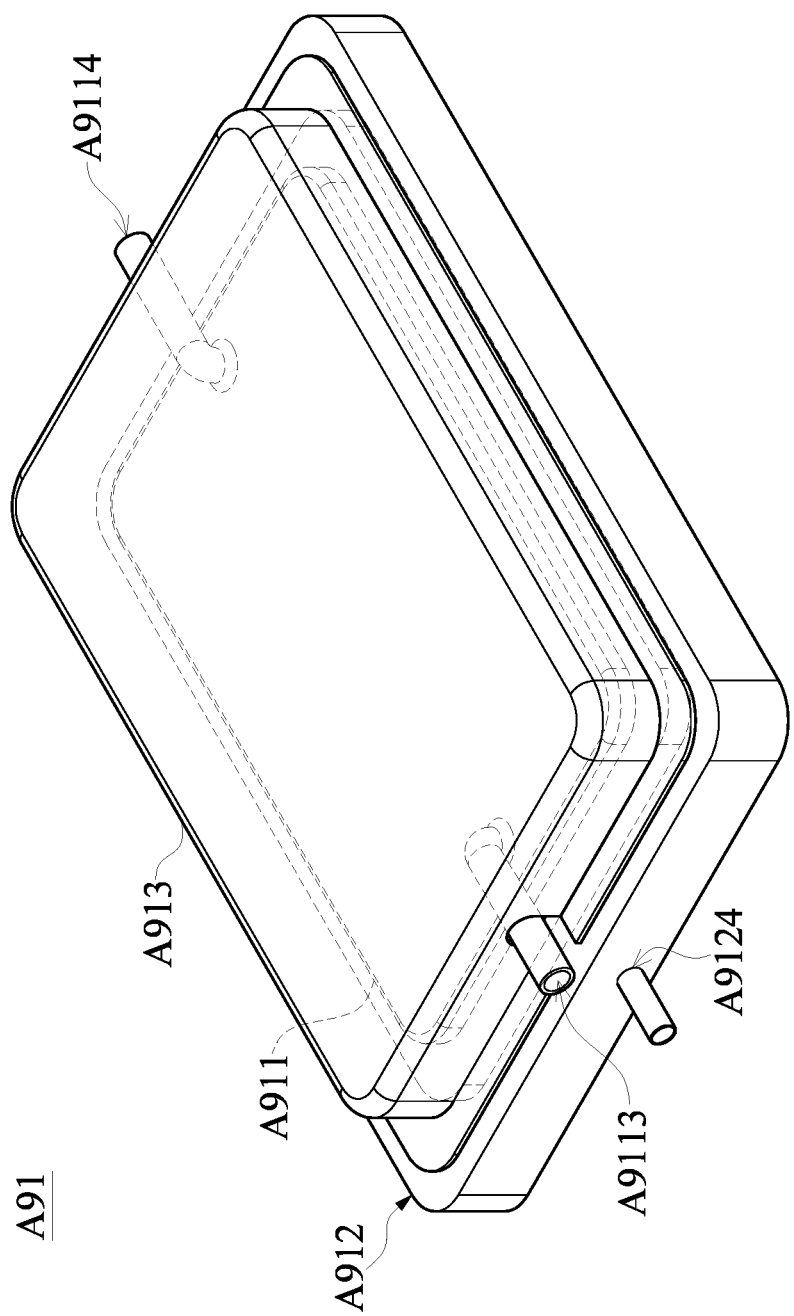
FIG. 9 is a schematic view of a temperature adjusting device of the system-level testing apparatus according to an embodiment of the present disclosure.

Referring to FIG. 4 to FIG. 8, FIG. 4 is a schematic view of an electrical connection socket of the system-level testing apparatus according to an embodiment of the present disclosure, FIG. 5 is a sectional exploded view of the electrical connection socket of the system-level testing apparatus of the present disclosure, FIG. 6 is a sectional view of the electrical connection socket without carrying a chip under test of the system-level testing apparatus of the present disclosure, FIG. 7 is a sectional view of the electrical connection socket carrying the chip under test of the system-level testing apparatus of the present disclosure, and FIG. 8 is a sectional view of the electrical connection socket carrying the chip under test and pressed by a pressing device of the system-level testing apparatus.

Referring to FIG. 4 to FIG. 6, each of the electrical connection sockets 2 includes a plurality of probe assemblies 20, a socket body 21, a lift structure 22, a supporting structure 23, and a plurality of elastic assemblies 24. Each of the probe assemblies 20 includes a pin 201 and a spring 202. An end of the pin 201 is configured to be in contact with a contact structure C1 of the chip under test C (shown in FIG. 7). The spring 202 is sleeved around the pin 201, and when an end of the pin 201 is pressed, the spring 202 is pressed and correspondingly generates an elastic returning force. Accordingly, when the pin 201 is no longer pressed, the spring 202 releases the elastic returning force to return the pin 201 to an initial position.

The socket body 21 has a top wall 211, an annular wall 212, and an abutting portion 213. The top wall 211 has an opening 21A. One end of the annular wall 212 is connected to a peripheral edge of the top wall 211, and the other end of the annular wall 212 is disposed and fixed on the carrying circuit board 1. The top wall 211, the annular wall 212, and the carrying circuit board 1 jointly define an accommodating slot 21B. The top wall 211 has an outer surface 2111 and an inner surface 2112 (as shown in FIG. 6) opposite to the outer surface 2111 (as shown in FIG. 6). In a practical application, the top wall 211 and the annular wall 212 can be integrally formed as a one-piece structure.

The lift structure 22 includes a base portion 221 and a carrying portion 222. The base portion 221 is entirely arranged in the accommodating slot 21B. The carrying portion 222 is formed by extending from the base portion 221, and is partially arranged in the opening 21A. The lift structure 22 includes four retaining portions 223 extending from the carrying portion 222 along a direction away from the base portion 221. The four retaining portions 223 can be respectively formed on four corners of the carrying portion 222. The four retaining portions 223 and the carrying portion 222 jointly form a chip receiving slot 22B for accommodating one of the chips under test C. The four retaining portions 223 are configured to be engaged with the chips under test C. The lift structure 22 further has a plurality of connection holes 22A (as shown in FIG. 5) penetratingly formed through the base portion 221 and the carrying portion 222.

Figure 15:
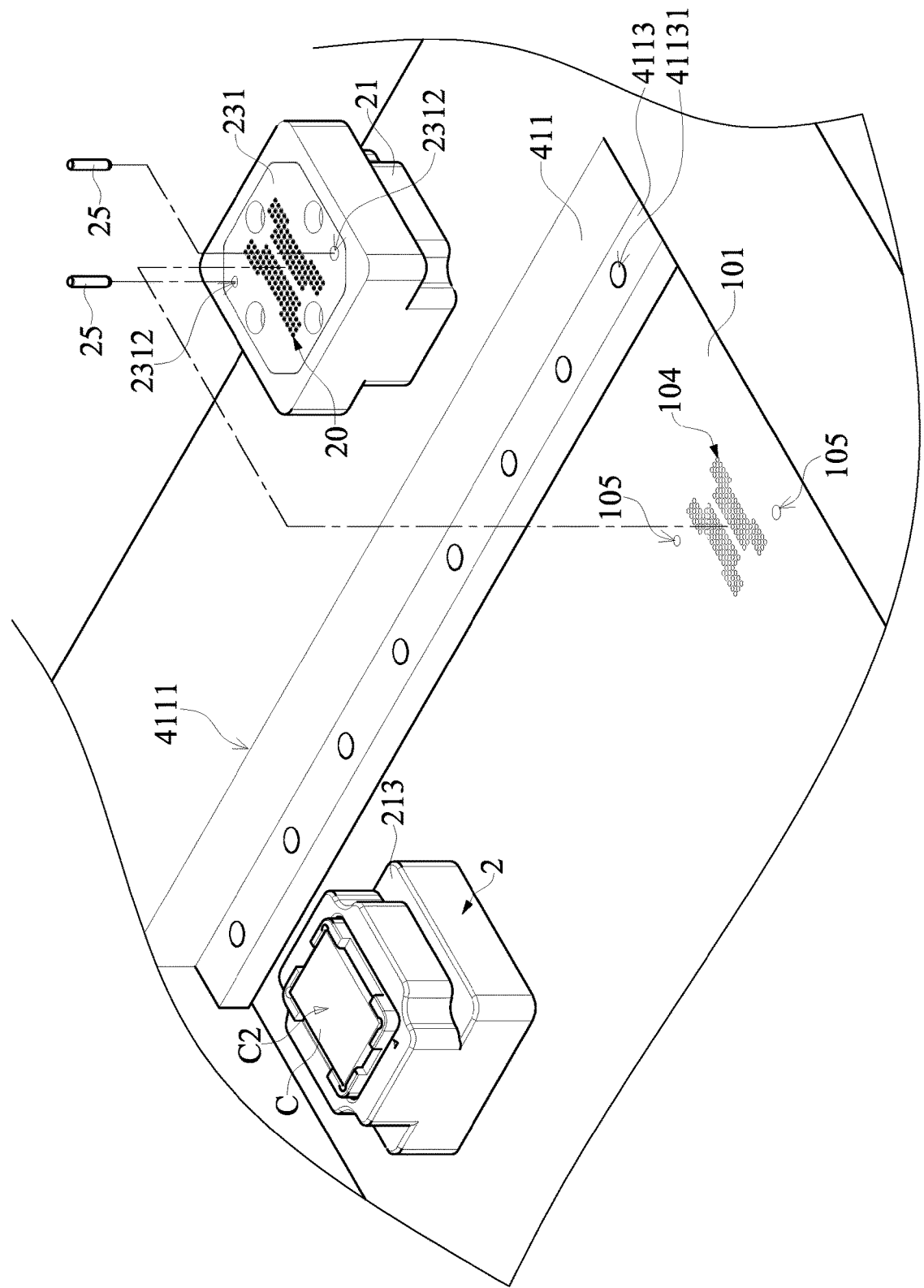
FIG. 15 is an exploded view of one of the electrical connection sockets and a carrying circuit board according to an embodiment of the present disclosure.

The probe assemblies 20 are partially fixed in the supporting structure 23, and first ends of the probe assemblies 20 are connected to a plurality of electrical contacting structures 104 (as shown in FIG. 15) of the carrying circuit board 1. The electrical contacting structures 104 are electrically connected to the connection circuit 103, and the electrical contacting structures 104 can be a plurality of metal terminals formed on the first board surface 101 of the carrying circuit board 1. Second ends of the probe assemblies 20 are in the connection holes 22A so as to be connected to the contact structures C1 of the chip under test C.

In a practical application, the supporting structure 23 can include a seat structure 231 and an auxiliary structure 232. The seat structure 231 is arranged in the accommodating slot 21B, and is fixed to the socket body 21 (e.g., the seat structure 231 and the socket body 21 can be fixed to each other by screws). The seat structure 231 has a plurality of thru-holes 2311, and the first ends of the probe assemblies 20 are fixed in the thru-holes 2311 of the seat structure 231. The auxiliary structure 232 is arranged in the accommodating slot 21B and between the seat structure 231 and the top wall 211, and the auxiliary structure 232 and the seat structure 231 are fixed to each other (e.g., by screws). The auxiliary structure 232 has a plurality of supporting holes 2321 spaced apart from each other. The supporting holes 2321 are respectively in spatial communication with the thru-holes 2311 of the seat structure 231, and respectively correspond in position to the connection holes 22A. The connection holes 22A, the supporting holes 2321, and the thru-holes 2311 jointly define a plurality of probe channels, and the probe assemblies 20 are respectively arranged in the probe channels.

As shown in FIG. 6, the supporting structure 23 is arranged in the accommodating slot 21B, and the elastic assemblies 24 are disposed between the supporting structure 23 and the lift structure 22. The elastic assemblies 24 are configured to push the base portion 221 of the lift structure 22 to abut against the inner surface 2112 of the top wall 211, so that the base portion 221 and the supporting structure 23 have a gap S there-between. In a practical application, when the electrical connection socket 2 is fixed to the carrying circuit board 1 and the retaining portions 223 are not pressed by an external force, the four elastic assemblies 24 between the lift structure 22 and the supporting structure 23 can be slightly compressed to generate an elastic returning force that pushes the lift structure 22 to firmly abut against the inner surface 2112 of the top wall 211.

As shown in FIG. 7, when the chip receiving slot 22B receives the corresponding chip under test C and the lift structure 22 is not pressed, the contact structures C1 of the chip under test C are respectively arranged in the connecting holes 22A, and the probe assemblies 20 are not connected to (e.g., not touch) the contact structures C1 of the chip under test C. When the lift structure 22 is pressed, at least part of the lift structure 22 is moved into the socket body 21. In other words, the lift structure 22 is moved toward the carrying circuit board 1 relative to the supporting structure 23, and the probe assemblies 20 would be in contact with the contact structures C1 of the chip under test C.

As mentioned above, in an embodiment of the present disclosure, each of the electrical connection sockets 2 of the chip carrying device A3 includes the lift structure 22, and the system-level testing apparatus A can further include a pressing device A8 (as shown in FIG. 2). The control device A4 is electrically connected to the pressing device A8, and the control device A4 can control the pressing device A8 to press on a plurality of side surfaces C2 (as shown in FIG. 7) of the chips under test C disposed on the electrical connection sockets 2. When the chips under test C disposed on the electrical connection sockets 2 and the lift devices 22 of the electrical connection sockets 2 are pressed by the pressing device A8, the contact structures C1 of the chips under test C are in contact with one end of the probe assemblies 20 in the electrical connection sockets 2 so that the chips under test C are electrically connected to the connection circuit 103 through the electrical connection sockets 2.

Referring to FIG. 2, in a practical application, the system-level testing apparatus A of the present disclosure can further include at least one temperature adjusting device A9. The temperature adjusting device A9 is electrically connected to the control device A4. The control device A4 can control the temperature adjusting device A9 so that the chips under test C and the system circuit board D can be performed with the system-level test operation in an environment having a predetermined high temperature or a predetermined low temperature together. In an embodiment of the present disclosure, the system circuit board D and the chip carrying device A3 are disposed in one of the accommodating chambers A10 of the apparatus body A1, and each of the accommodating chambers A10 can have a movable door. When the movable door is closed, and the corresponding one of the accommodating chambers A10 is in an enclosed state, the control device A4 can control the temperature adjusting device A9 to be operated so that a temperature of the corresponding one of the accommodating chambers A10 is increased to the predetermined high temperature or is decreased to the predetermined low temperature. The present disclosure does not limit the way where the temperature adjusting device A9 adjusts the temperature of the corresponding one of the accommodating chambers A10. The specific embodiments about the temperature adjusting device A9 are described as follows. For clearly description, two different numerals are respectively corresponding to two different temperature adjusting devices A9, i.e., temperature adjusting device A91 and temperature adjusting device A92.

Figure 10:
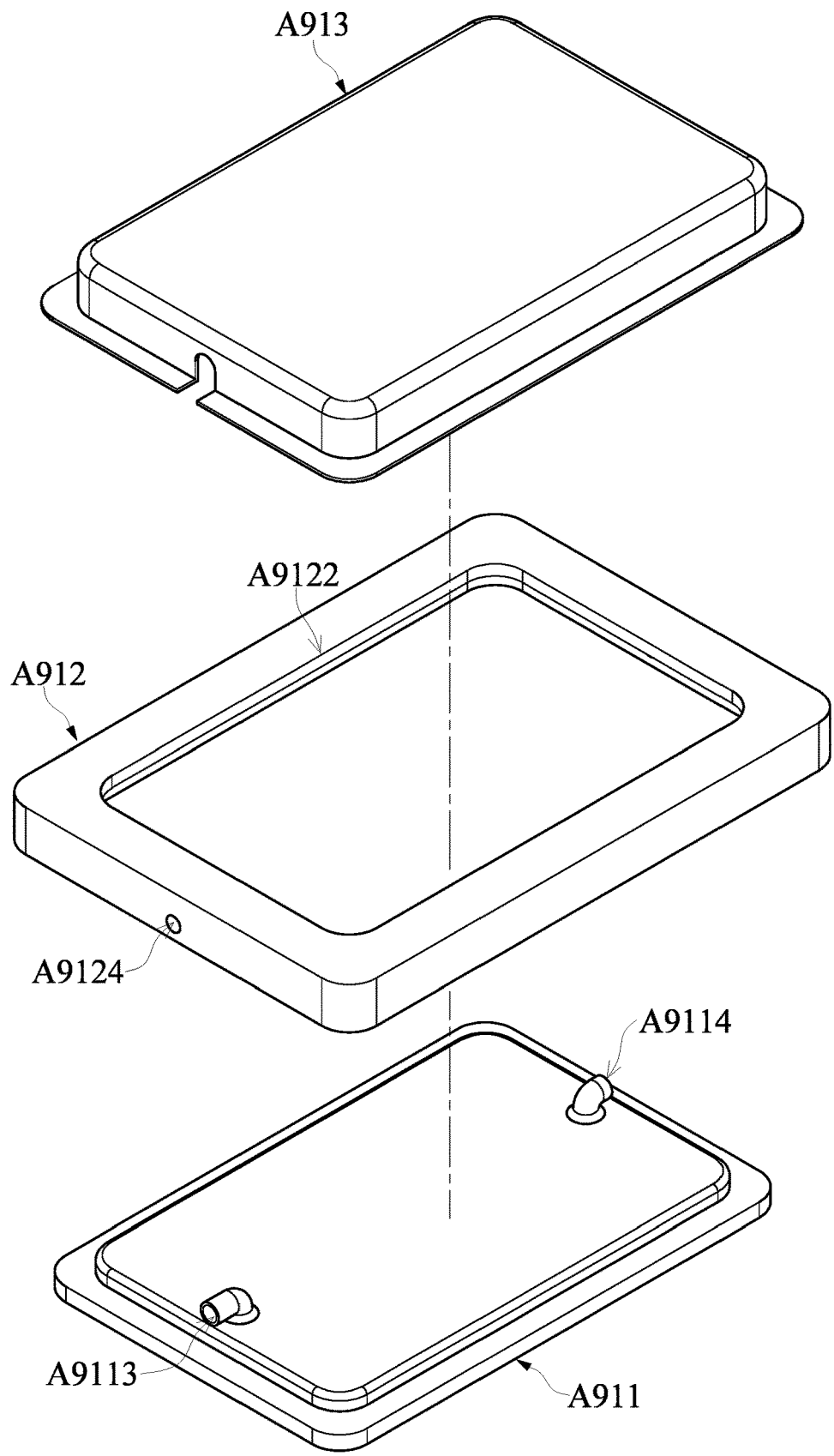
FIG. 10 and FIG. 11 are exploded views of the temperature adjusting device of the system-level testing apparatus according of the present disclosure.
Figure 11:
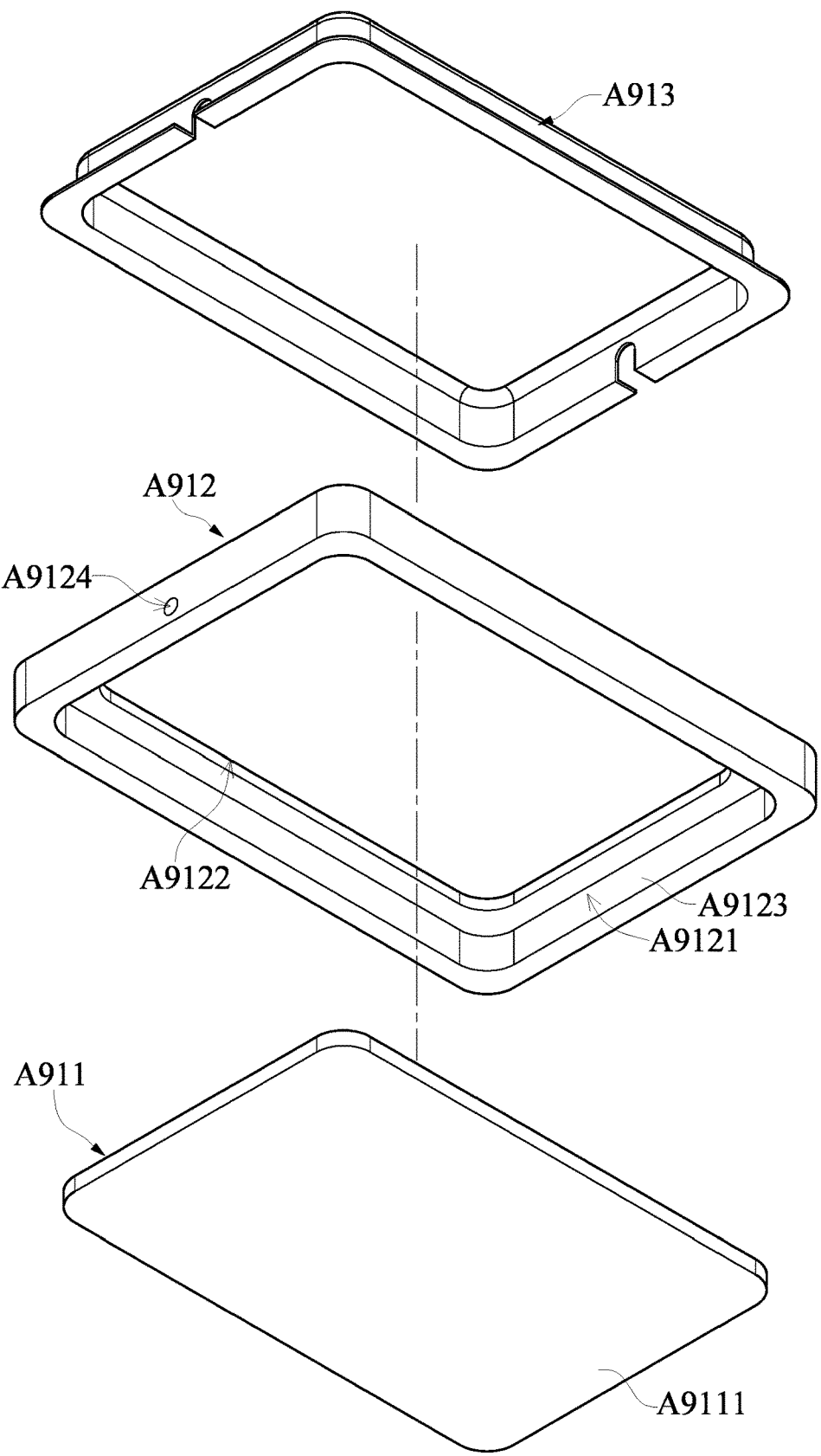
Figure 12:
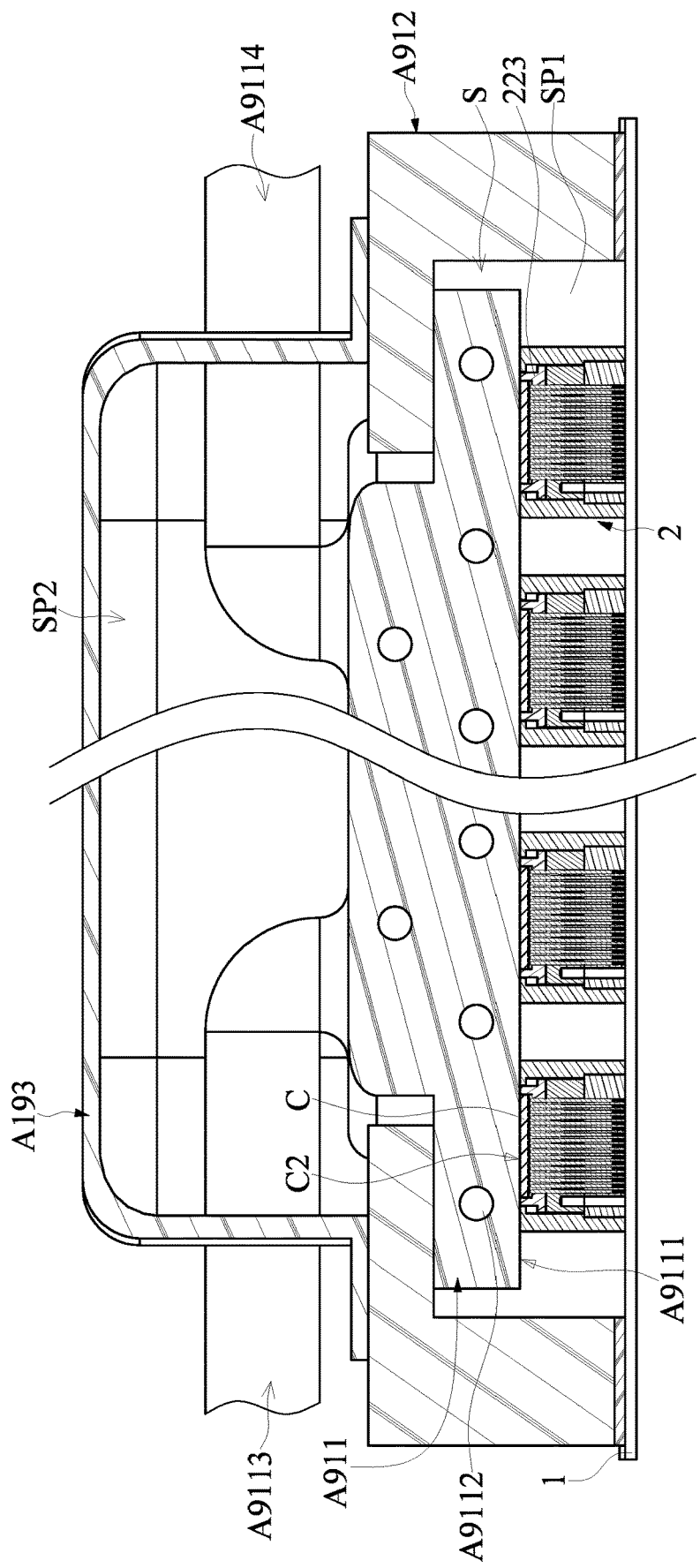
FIG. 12 is a sectional view of the temperature adjusting device disposed on the chip carrying device of the system-level testing apparatus of the present disclosure.
Figure 13:
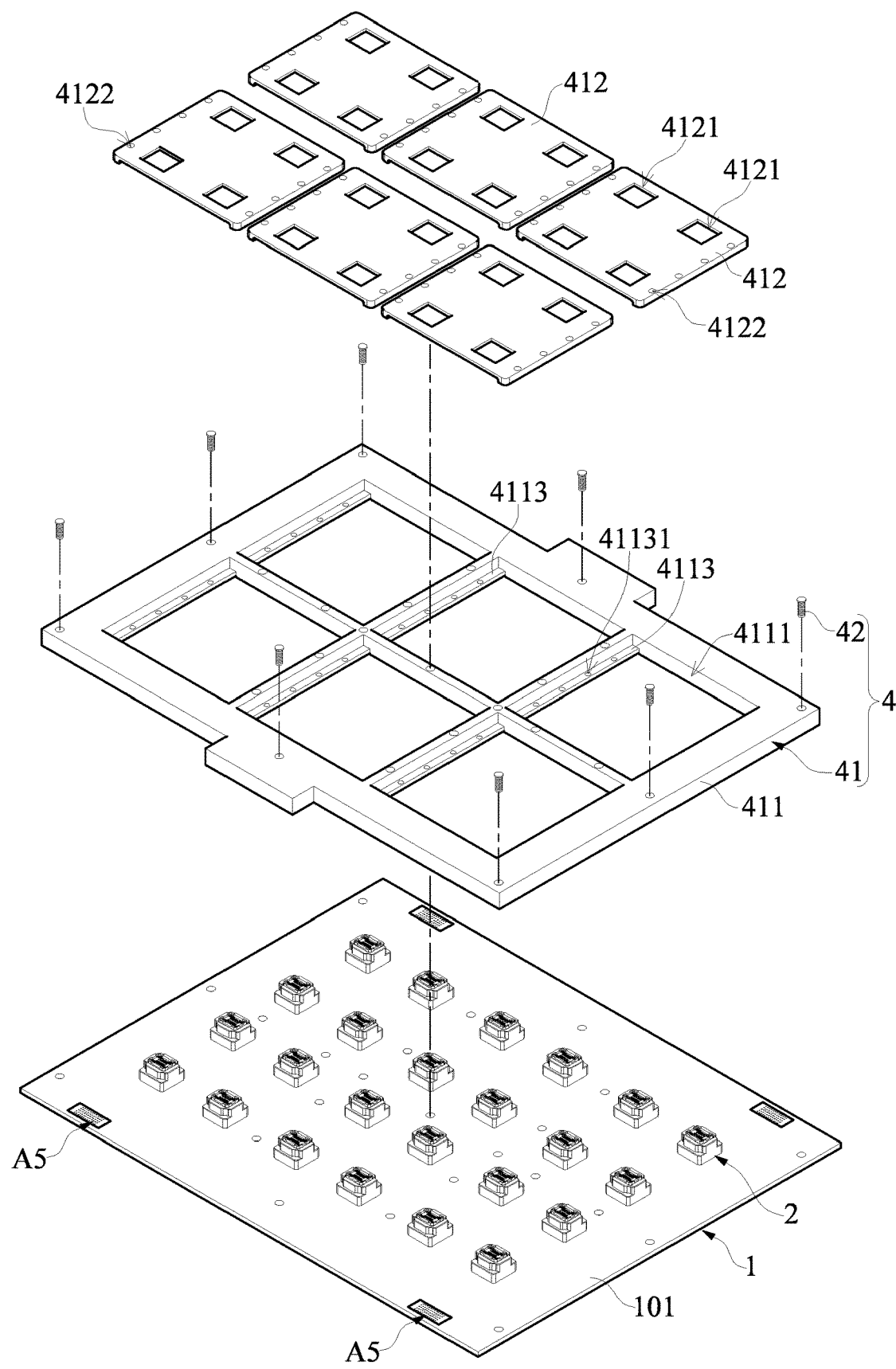
FIG. 13 and FIG. 14 are respectively an exploded view and an assembled view of the chip carrying device of the system-level testing apparatus according to an embodiment of the present disclosure.

Referring to FIG. 1, and FIG. 9 to FIG. 12, FIG. 9 is a schematic view of a temperature adjusting device of the system-level testing apparatus according to an embodiment of the present disclosure, FIG. 10 and FIG. 11 are exploded views of the temperature adjusting device of the system-level testing apparatus according of the present disclosure, and FIG. 12 is a sectional view of the temperature adjusting device disposed on the chip carrying device of the system-level testing apparatus of the present disclosure.

Further, the temperature adjusting device A9 can include a contacting structure A911 and a cover A912. The contacting structure A911 includes a contacting surface A9111. The contacting structure A911 is configured to press on the retaining portions 223 (as shown in FIG. 12) of the electrical connection sockets 2. When the contacting structure A911 presses on the retaining portions 223 of the electrical connection sockets 2, the contacting surface A9111 abuts the side surfaces C2 of the chips under test C carried by the electrical connection sockets 2. The contacting structure A911 can internally include at least one fluid channel A9112, a fluid entrance A9113, and a fluid exit A9114, and the fluid channel A9112, the fluid entrance A9113, and the fluid exit A9114 are in spatial communication with each other. A high-temperature fluid or a low-temperature fluid can flow into the fluid channel A9112 through the fluid entrance A9113 and can exit the fluid channel A9112 through the fluid exit A9114. When the high-temperature fluid or the low-temperature fluid flows in the fluid channel A9112, a temperature of the contacting surface A9111 is accordingly increased or decreased. Therefore, the chips under test C that are in contact with the contacting surface A9111 can be performed with the system-level test operation in an environment having the predetermined high temperature or the predetermined low temperature.

In a practical application, the control device A4 can be electrically connected to a fluid apparatus that provides the high-temperature fluid or the low-temperature fluid. The fluid apparatus is connected to the fluid entrance A9113 and the fluid exit A9114 of the contacting structure A911 through a plurality of pipes. The control device 4 can control the fluid apparatus so that the high-temperature fluid or the low-temperature fluid flows through the pipes and the fluid entrance A9113 and then enters the fluid channel A9112 of the contacting structure A911. Therefore, the temperature of the contacting surface A9111 is increased or decreased.

It should be noted that in other embodiments, the contacting structure A911 can be provided without the fluid channel A9112 disposed therein, the contacting structure A911 can be connected to an electric heater, and a heating coil of the electric heater can be buried in the contacting structure A911. The control device A4 is electrically connected to the electric heater, the control device A4 can control the electric heater to be operated so that the heat coil generates heat, and the temperature of the contacting structure A911 can be increased to the predetermined high temperature. Relatively, the contacting structure A911 can be provided with a cooling chip disposed therein, and the control device A4 can control the cooling chip to be operated so that the temperature of the contacting surface A9111 can be decreased to the predetermined low temperature.

It should be noted that in other embodiments, the contacting structure A911 can include both the fluid channel A9112 and the electric heater. The fluid channel is provided so that the low-temperature fluid can flow through the fluid channel A9112 and the temperature of the contacting structure A911 is decreased, and the electric heater is configured to increase the temperature of the contacting structure A911. In addition, it is worth mentioning that in a practical application, the pressing device A8 and the temperature adjusting device A9 can be a joint device. In other words, the pressing device A8 can correspondingly have the contacting structure A911.

Referring to FIG. 10 and FIG. 11, the cover A912 has a concavity A9121 formed on one side thereof and an accommodating opening A9122. The accommodating opening A9122 is in spatial communication with the concavity A9121. The contacting structure A911 is fixed in the concavity A9121 of the cover A912, and the fluid entrance A9113 and the fluid exit A9114 of the contacting structure A911 correspondingly penetrate through the accommodating opening A9122. The contacting structure A911 is fixed on the cover A912, a size of the contacting surface A9111 is less than a size of the cover A912, and a gap is between an outer periphery of the contacting structure A911 and an inner wall surface A9123 of the cover A912 that defines the concavity A9121. Therefore, when the cover A912 covers on the first board surface 101 of the carrying circuit board 1 (as shown in FIG. 12), the contacting structure, the cover A912, and the carrying circuit board 1 jointly define an enclosed space SP1.

In a practical application, the cover A912 can have at least one air suction hole A9124. The air suction hole A9124 is connected to an air suction device E connected to the system-level testing apparatus A, and the control device A4 is configured to control the air suction device E to suction away air in the enclosed space SP1 through the air suction hole A9124. When air is suctioned away by the air suction device E, the enclosed space SP1 is in a substantial vacuum state. Therefore, a force for causing the contacting structure A911 to press on the retaining portions 223 of the electrical sockets 2 is effectively reduced, and a temperature of the enclosed space SP1 is not easily affected by a temperature outside of the enclosed space SP1. Referring to FIG. 10 and FIG. 11, a lid A913 can be disposed on the cover A912, the lid A913 and the contacting structure A911 can jointly define an accommodating space SP2 there-between, and the accommodating space SP2 can be filled with any member that can provide heat insulation effects.

Figure 14:
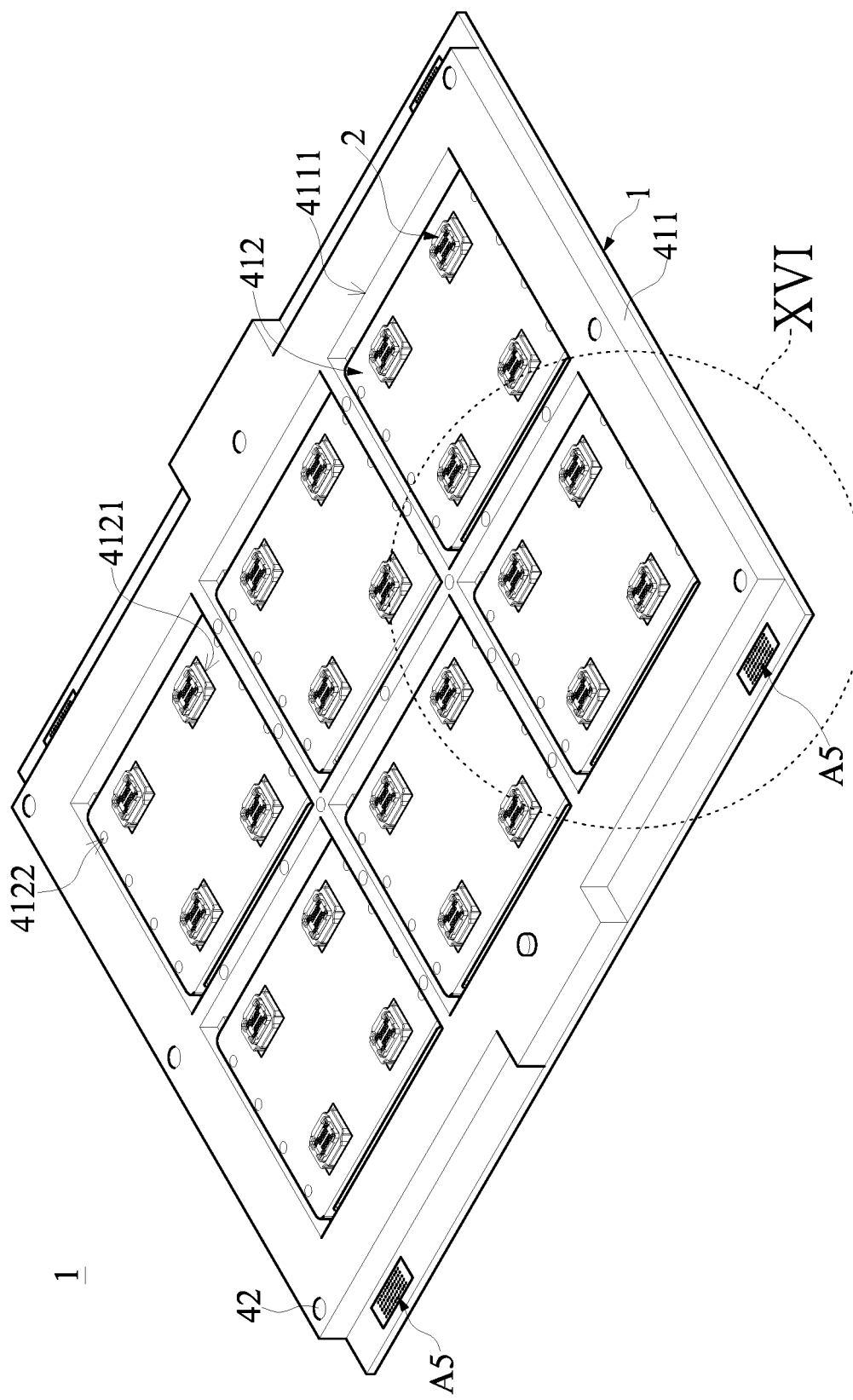
Figure 16:
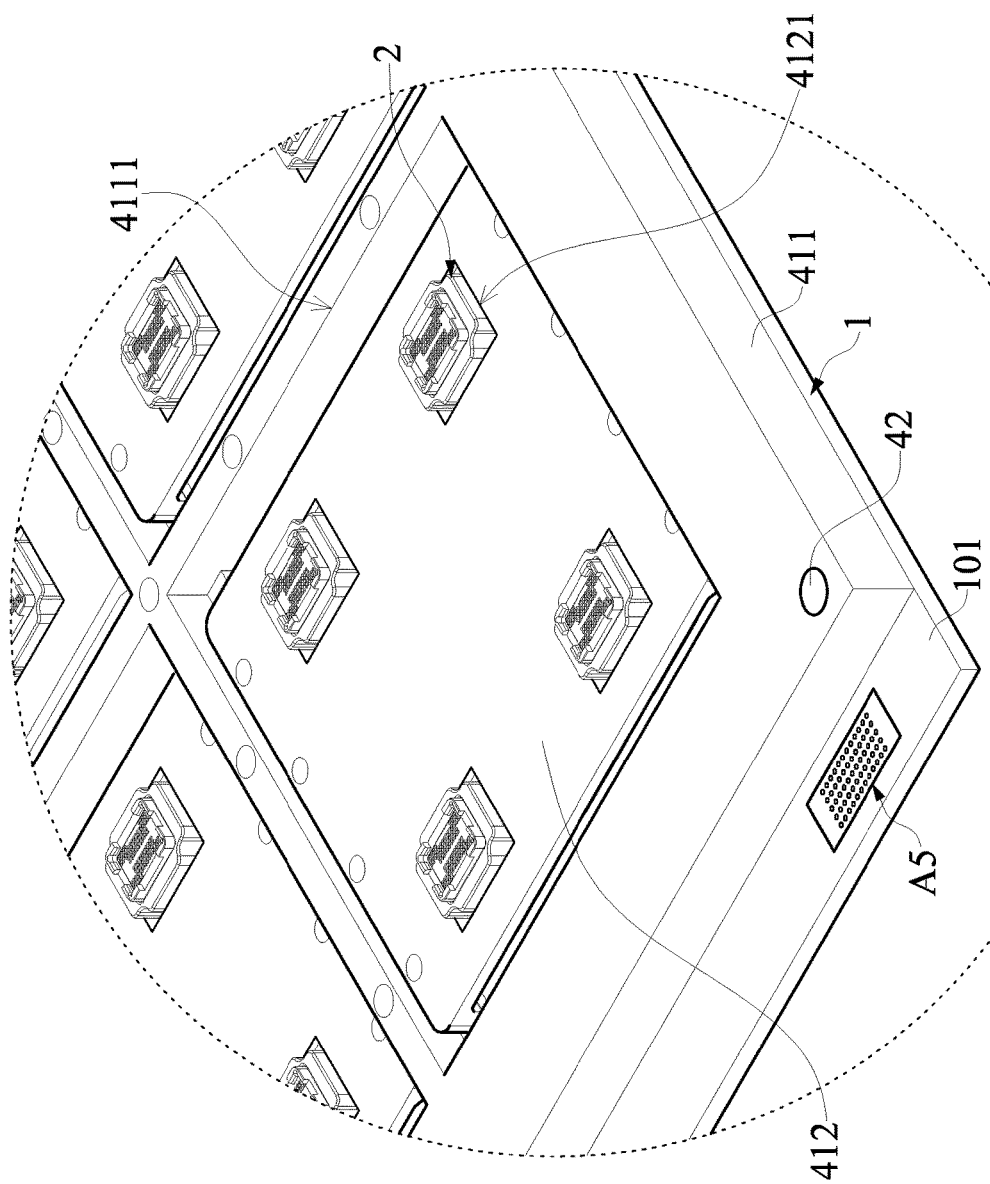
FIG. 16 is a partially enlarged view of the chip carrying device of the system-level testing apparatus of the present disclosure shown in FIG. 14.

Referring to FIG. 13 to FIG. 17, FIG. 13 and FIG. 14 are respectively an exploded view and an assembled view of the chip carrying device of the system-level testing apparatus according to an embodiment of the present disclosure, FIG. 15 is an exploded view of one of the electrical connection sockets and a carrying circuit board according to an embodiment of the present disclosure, and FIG. 16 is a partially enlarged view of the chip carrying device of the system-level testing apparatus of the present disclosure shown in FIG. 14. In a practical application, for being conveniently mounted, detached, and maintained, the electrical connection sockets 2 can be detachably disposed on the carrying circuit board 1. Specifically, the electrical connection sockets 2 can be fixed onto the first board surface 101 of the carrying circuit board 1 without screws.

Further, the chip carrying device A3 can include a fixing assembly 4, the fixing assembly 4 includes a fixing member 41 and a plurality of screwing members 42, and the fixing member 41 can include a fixing body 411 and a plurality of pressing structures 412. The fixing body 411 has a plurality of accommodating holes 4111. The fixing body 411 is detachably fixed onto the first board surface 101 of the carrying circuit board 1. For example, the fixing body 411 and the carrying circuit board 1 can correspondingly have a plurality of corresponding screwing holes, and the fixing body 411 and the carrying circuit board 1 can be fixed with each other through the screwing members 42 (e.g., screws).

The pressing structures 412 are detachably fixed on the fixing body 411, and each of the pressing structures 412 is disposed corresponding to one of the accommodating holes 4111. Each of the pressing structures 412 includes a plurality of thru-holes 4121. The fixing body 411 can have a plurality of auxiliary fixing portions 4113 formed near each of the accommodating holes 4111. Each of the auxiliary fixing portions 4113 has a plurality of screwing holes 41131, each of the pressing structures 412 has a plurality of corresponding screw holes 4122, and the pressing structures 412 can be detachably fixed on the auxiliary fixing portions 4113 in cooperation with a plurality of screwing members (e.g., screws).

Referring to FIG. 15, the first board surface 101 of each of the carrying circuit boards 1 can have a plurality of electrical contacting structures 104, and each of the electrical contacting structures 104 is connected to the connection circuit 103. The electrical contacting structures 104 can be the metal terminals formed on a surface of the carrying circuit board 1. One end of the probe assemblies 20 included by each of the electrical connection sockets 2 can protrude from one end of the supporting structure 23 of the corresponding one of the electrical connection sockets 2. One end of the probe assemblies 20 exposed from the supporting structure 23 is configured to be in contact with the electrical contacting structures 104 of the carrying circuit board 1. Each of the electrical connection sockets 2 can have an abutting portion 213 that protrudes from the annular wall 212. When the pressing structures 412 press on the fixing body 411, the pressing structures 412 correspondingly press on the abutting portions 213 of the electrical connection sockets 2. In other words, each of the abutting portions 213 is provided for the pressing structures 412 to press thereon, and a structure of each of the abutting portions 213 can be designed corresponding to the pressing structures 412 and the thru-holes 4121.

Referring to FIG. 16, when the fixing body 411 is fixed onto the first board surface 101 of the carrying circuit board 1 with the electrical connection sockets 2 disposed on the carrying circuit board 1, and the pressing structures 412 are fixed on the fixing body 411, the pressing structures 412, the fixing body 411, and the carrying circuit board 1 jointly hold the electrical connection sockets 2 so that the electrical connection sockets 2 are fixed onto the first board surface 101 of the carrying circuit board 1.

As mentioned above, because of the cooperation between the fixing assembly 4 and the carrying circuit board 1, the electrical connection sockets 2 can be fixed onto the first board surface 101 of the carrying circuit board 1. Therefore, the electrical connection sockets 2 can be fixed onto one side of the carrying circuit board 1 without screws.

Referring to FIG. 15, to facilitate related personnel to correctly allow the probe assemblies 20 exposed from the electrical connection sockets 2 to be in contact with the electrical contacting structures 104 of the carrying circuit board 1, the supporting structure 23 of each of the electrical connection sockets 2 can include a plurality of positioning holes 2312, the carrying circuit board 1 can have a plurality of corresponding positioning holes 105, and the positioning holes 2312 of the electrical connection sockets 2 and the positioning holes 105 of the carrying circuit board 1 can be inserted by a plurality of positioning members 25 so as to facilitate a user to correctly dispose the electrical connection sockets 2 onto the carrying circuit board 1.

Figure 17:
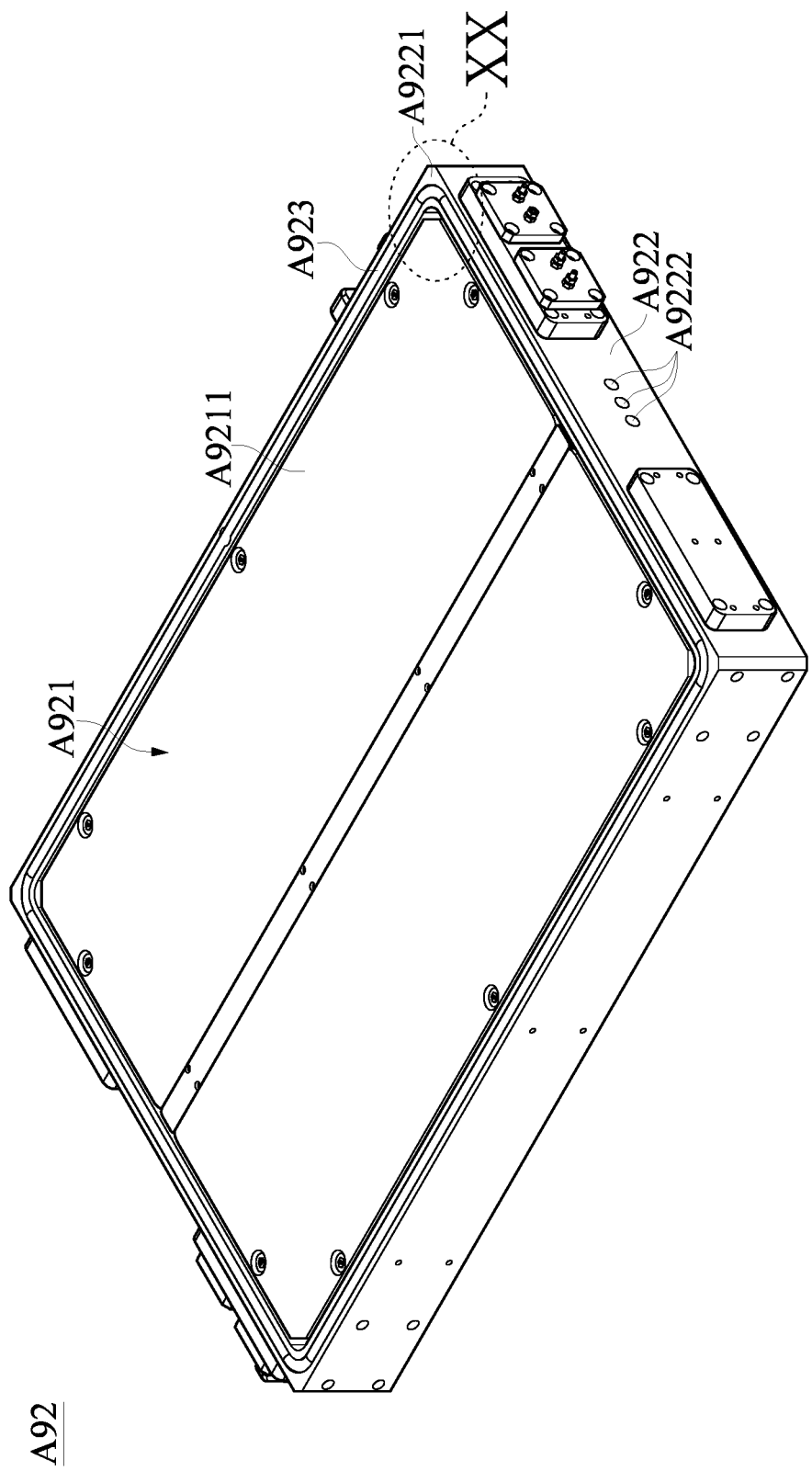
FIG. 17 is a schematic view of the temperature adjusting device of the system-level testing apparatus according to an embodiment of the present disclosure.

Referring to FIG. 17, FIG. 17 is a schematic view of the temperature adjusting device of the system-level testing apparatus according to an embodiment of the present disclosure. The temperature adjusting device A92 can include a contacting structure A921, a frame body A922, and an elastic annular enclosed member A923. The temperature adjusting device A92 includes a temperature adjuster disposed therein, the temperature adjuster is connected to the contacting structure A921, the temperature adjuster can be controlled so that a temperature of the contacting structure A921 is increased to a predetermined high temperature, and the temperature adjuster can be controlled so that the temperature of the contacting structure A921 is decreased to a predetermined low temperature. In a practical application, the temperature adjuster can include a heating coil or a cooling chip, but the present disclosure is not limited thereto.

The frame body A922 surrounds the contacting structure A921, a contacting surface A9211 of the contacting structure A921 can be flush with an annular abutting surface A9221 of the frame body A922, and the elastic annular enclosed member A923 is disposed on the annular abutting surface A9221. In other embodiments of the present disclosure, the contacting surface A9211 can be higher than the annular abutting surface A9221, but the contacting surface A9211 cannot be lower than the annular abutting surface A9221. The elastic annular enclosed member A923 is disposed on the annular abutting surface A9221, and the elastic annular enclosed member A923 is surroundingly disposed corresponding to the contacting structure A921. The elastic annular enclosed member A923 can be made of a material capable of recovering after being pressed (e.g., rubber) according to practical requirements, but the present disclosure is not limited thereto. A cross section of the elastic annular enclosed member A923 can be circular, elliptical, or trapezoidal, but the present disclosure is not limited thereto.

Figure 18:
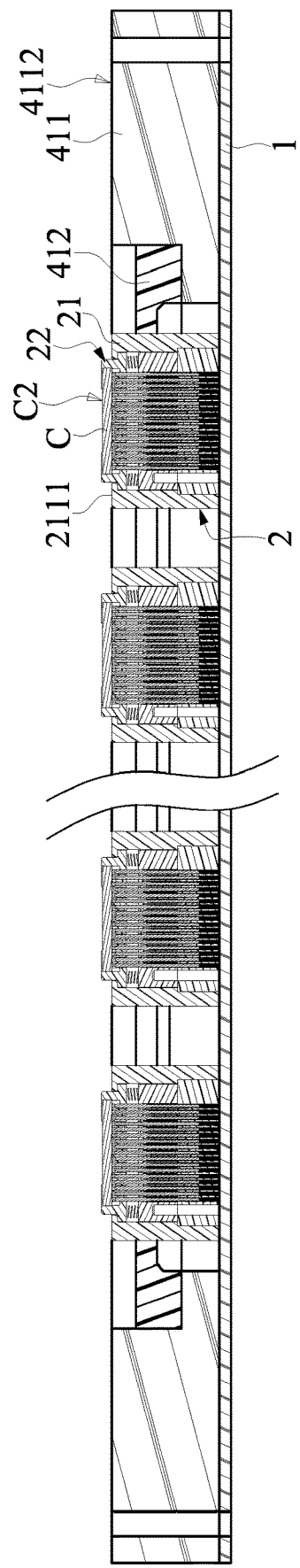
FIG. 18 is a partially sectional view of the chip carrying device of the system-level testing apparatus of the present disclosure shown in FIG. 14.
Figure 19:
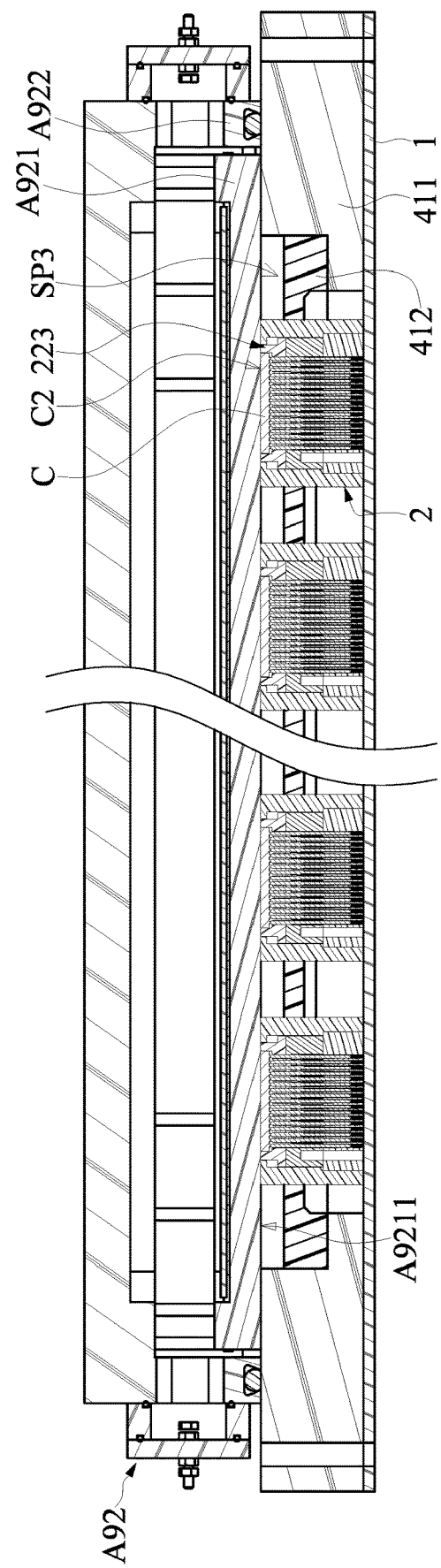
FIG. 19 is a sectional view of the temperature adjusting device of the system-level testing apparatus of the present disclosure shown in FIG. 17 abutted against the chip carrying device of the system-level testing apparatus of the present disclosure shown in FIG. 14.
Figure 20:
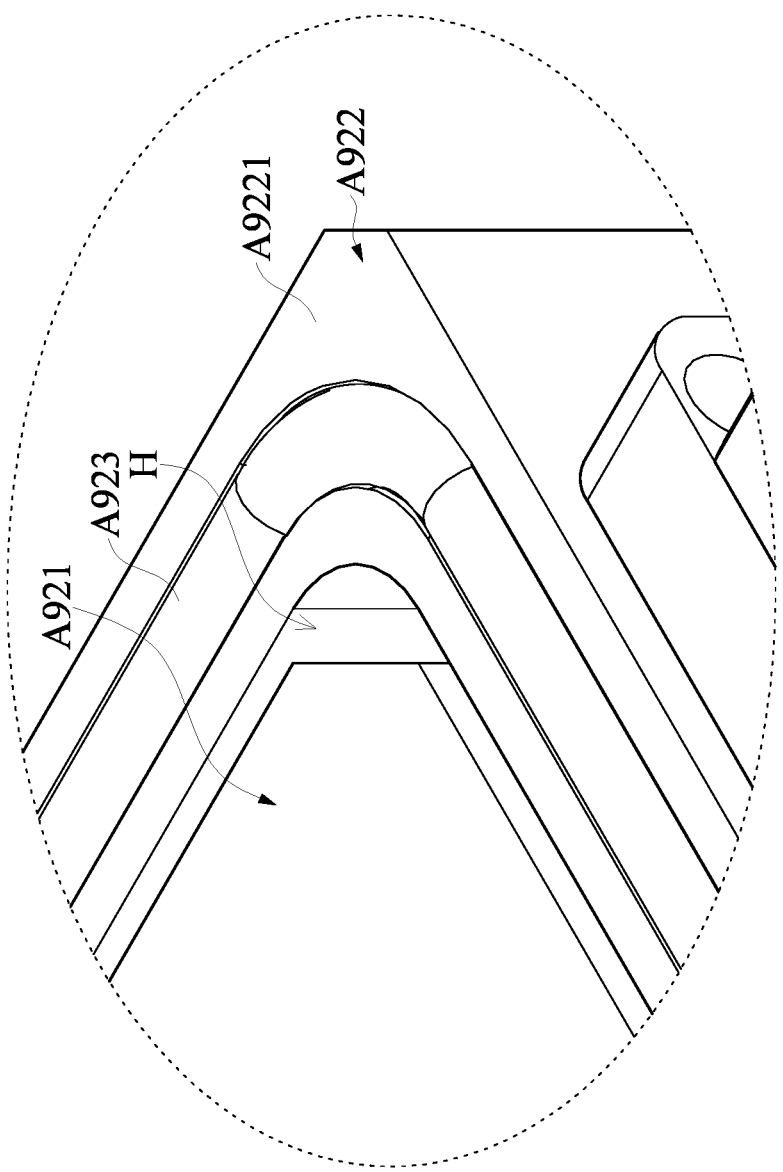
FIG. 20 is a partially enlarged view of the chip carrying device of the system-level testing apparatus of the present disclosure shown in FIG. 17.

Referring to FIG. 18 to FIG. 20, FIG. 18 is a partial sectional view of the chip carrying device of the system-level testing apparatus of the present disclosure shown in FIG. 14, FIG. 19 is a sectional view of the temperature adjusting device of the system-level testing apparatus of the present disclosure shown in FIG. 17 abutted against the chip carrying device of the system-level testing apparatus of the present disclosure shown in FIG. 14, and FIG. 20 is a partially enlarged view of the chip carrying device of the system-level testing apparatus of the present disclosure shown in FIG. 17. As shown in FIG. 18, when the chip carrying device A3 is not pressed by the contacting structure A921 of the temperature adjusting device A92, an abutting surface 4112 of the fixing body 411 of the fixing member 41 is flush with the outer surface 2111 of each of the socket bodies 21, and a part of the lift structure 22 of each of the electrical connection sockets 2 is higher than the abutting surface 4112. That is to say, when the chips under test C are disposed on the electrical connection sockets 2 and the chip carrying device A3 is not pressed by the contacting structure A921 of the temperature adjusting device A92, a part of the lift structure 22 can be higher than the abutting surface 4112. The chips under test C in the lift structures 22 can be higher than the abutting surface 4112 or not higher than the abutting surface 4112, and the present disclosure is not limited thereto.

Referring to FIG. 19, when the contacting structure A912 presses the side surfaces C2 of the chips under test C carried by the chip carrying device A3, a part of the contacting structure A921 simultaneously presses the abutting surface 4112 of the fixing body 411, the elastic annular enclosed member A923 correspondingly presses the abutting surface 4112 of the fixing body, the contacting structure A921, the fixing body 411, the pressing structures 412, and the carrying circuit board jointly define an enclosed space SP3, and the electrical connection sockets 2 are correspondingly arranged in the enclosed space SP3.

When the contacting structure A921 presses the side surface C2 of the chips under test C carried by the chip carrying device A3 and the electrical connection sockets 2 are correspondingly arranged in the enclosed space SP3, the control device A4 can control the air suction device E connected to the system-level testing apparatus A to be operated to suction away air in the enclosed space SP3 so that the enclosed space SP3 is in a substantial vacuum state. When air in the enclosed space SP3 is suctioned away, the chip carrying device A3 is affected by a negative pressure so that the chip carrying device A3 and the temperature adjusting device A92 are tightly abutted against each other.

As shown in FIG. 20, in a practical application, the contacting structure A921 and the frame body A922 jointly define an air suction gap H there-between. The air suction gap H can surround the contacting structure A921, and the frame body A922 can have a plurality of air suction holes A9222 in spatial communication with the air suction gap H (e.g., through corresponding tunnels in the frame body A9222). The air suction holes A9222 are configured to be in spatial communication with the air suction device E. The air suction gap H of the present embodiment substantially surrounds the contacting structure A9222, but as long as the enclosed space SP can be in spatial communication with the air suction device E through the air suction gap H and the air suction holes E352, the present disclosure does not limit the disposed position and the structure of the air suction gap H. In addition, the quantity, structure, and the disposed position of the air suction holes A9222 can be changed according to practical requirements.

In an embodiment of the present disclosure, the control device A4 is connected to the air suction device E, the central control device E1 can control the air suction device E to suction away an air in the enclosed space SP3 at a predetermined condition that is determined according to design requirements, and the present disclosure is not limited thereto. In addition, the control device A4 can determine whether the control device A4 controls the air suction device E to start suctioning air in the enclosed space according to a signal transmitted back by a related sensor.

Referring to FIG. 1 and FIG. 2, the temperature adjusting devices A9 in the previous embodiments can be correspondingly disposed in the accommodating chambers A10, and each of the temperature adjusting devices A9 can be disposed above a position of the corresponding one of the accommodating chambers A10 where the system circuit board D is disposed. In other words, when the system circuit board D and the chip carrying device A3 are disposed in the corresponding one of accommodating chambers A10, one of the temperature adjusting devices A9 is correspondingly arranged above the system circuit board D and the chip carrying device A3. In an embodiment of the present disclosure, each of the accommodating chambers A10 is provided with one of the temperature adjusting devices A9 disposed therein, the system-level testing apparatus A has the lift device A7, and the control device A4 can control the lift device A7 so that the system circuit board D and the chip carrying device A3 disposed on the system circuit board D move toward one of the temperature adjusting devices A9 together until the side surfaces C2 (as shown in FIG. 8) of the chips under test C carried by the electrical connection sockets 2 are in contact with the contacting surface of the contacting structure of the corresponding one of the temperature adjusting devices A9.

In other embodiments, the lift device A7 can be connected to one of the temperature adjusting devices A9. When the control device A4 controls the lift device A7 to be operated, the lift device A7 moves the corresponding one of the temperature adjusting devices A9 toward the carrying circuit board 1 unit and the contacting surface of the contacting structure of the corresponding one of the temperature adjusting devices A9 abuts against the side surfaces C2 of the chips under test C carried by the electrical connection sockets 2.

According to the above, in an embodiment of the present disclosure, the system-level testing apparatus A has the temperature adjusting devices A9 and the lift device A7, the system-level testing device A is connected to the air suction device E, and the system-level testing apparatus A can be operated as follows. The system circuit board D and the chip carrying device A3 can be disposed in one of the accommodating chambers A10 by related personnel or machines, the control device A4 can control the lift device A7 to be operated, so that the side surfaces C2 of the chips under test C carried by the chip carrying device A3 abut against the contact surface of the contacting structure of the corresponding one of the temperature adjusting devices A9. Afterwards, the control device A4 controls the corresponding one of the temperature adjusting devices A9 to be operated so that a temperature of the contacting surface reaches the predetermined high temperature or the predetermined low temperature. When the temperature of the contacting surface reaches the predetermined high temperature or the predetermined low temperature, the control device A4 provides electricity to the chips under test C and the system circuit board D, and the control device A4 transmits test signals to the chips under test C and the system circuit board D so as to perform the system-level test operation to the chips under test C and the system circuit board D.

After the control device A4 performs the system-level test operation to the chips under test C and the system circuit board D, the control device A4 can control a related reminder (e.g., an amplifier or a warning lamp) to be operated to remind related personnel that the chips under test C and the system circuit board D have already finished the system-level test operation. Naturally, in other embodiments, the control device A4 can transmit a related signal to a related transferring device (e.g., a robot arm), and the transferring device moves the chip carrying device A3 and the system circuit board D out of the corresponding one of the accommodating chambers A10.

Figure 21:
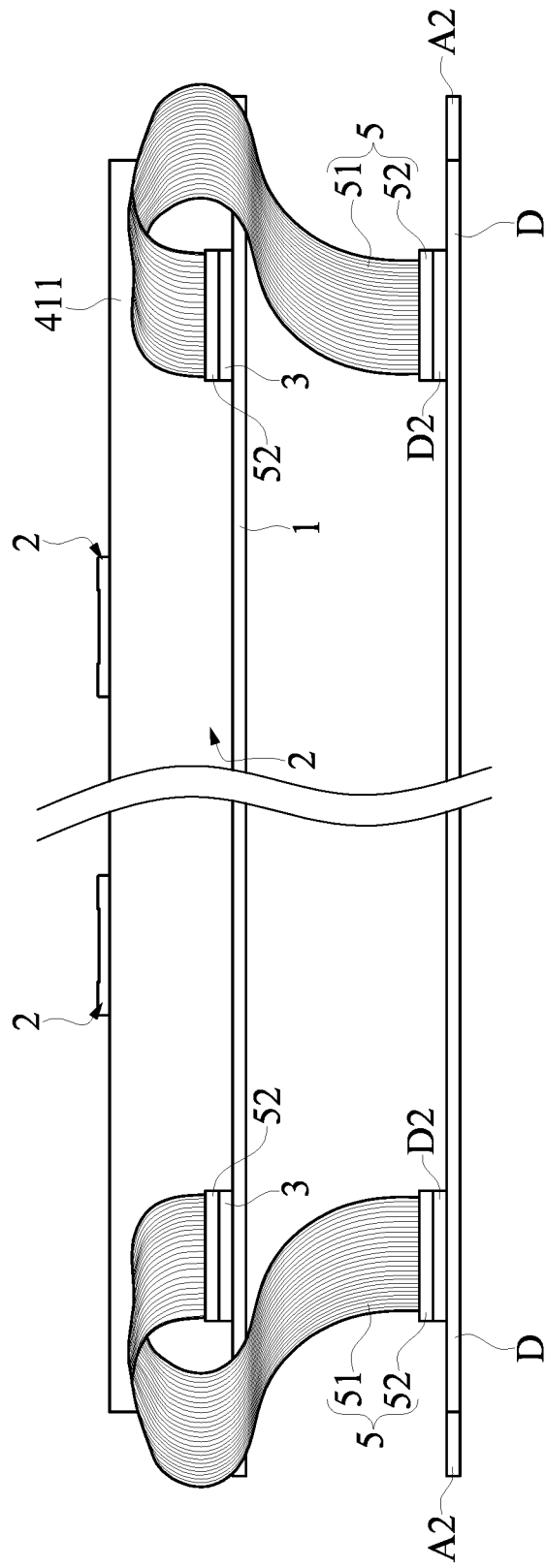
FIG. 21 is a side view of the system-level testing apparatus according to an embodiment of the present disclosure.

Referring to FIG. 21, FIG. 21 is a side view of the system-level testing apparatus according to an embodiment of the present disclosure. The difference between the present embodiment and the previous embodiment is that the system-level testing apparatus A further includes a plurality of auxiliary connection members 5, and each of the auxiliary connection members 5 includes a plurality of connection wires 51 and a connection port 52. In each of the auxiliary connection members 5, one end of each of the connection wires 51 is connected to the corresponding one of the system connection structures D2, and another end of each of the connection wires 51 is connected to the connection port 52.

In a practical application, each of the connection wires 51 of the auxiliary connection members 5 can be a flat flexible cable, each of the auxiliary connection members 5 can include two connection ports 52, two ends of each of the connection wires 51 are correspondingly connected to the two connection ports 52, and the two connection ports 52 of each of the auxiliary connection members 5 are correspondingly connected to the corresponding one of the system connection structures D2 of the system circuit board D and the corresponding one of the connection structures 3 of the carrying circuit board 1.

In other words, the connection structures 3 of the carrying circuit board 1 and the connection structures 3 of the system circuit board D are connected with each other through the auxiliary connection members 5, the carrying circuit board 1 and the system circuit board D are electrically connected with each other through the auxiliary connection members 5, and electricity provided by the power supply apparatus connected to the system circuit board D can be transmitted to each of the electrical connection sockets 2 on the carrying circuit board 1 and the chip under test C carried by the corresponding one of the electrical connection sockets 2 through the auxiliary connection members 5. Since the carrying circuit board 1 and the system circuit board D are connected with each other through the auxiliary connection members 5, it is not necessary for the carrying circuit board 1 to be fixed onto one side of the system circuit board D, and the carrying circuit board 1 and the system circuit board D can be fixed in the apparatus body A through different fixing structures.

Figure 22:
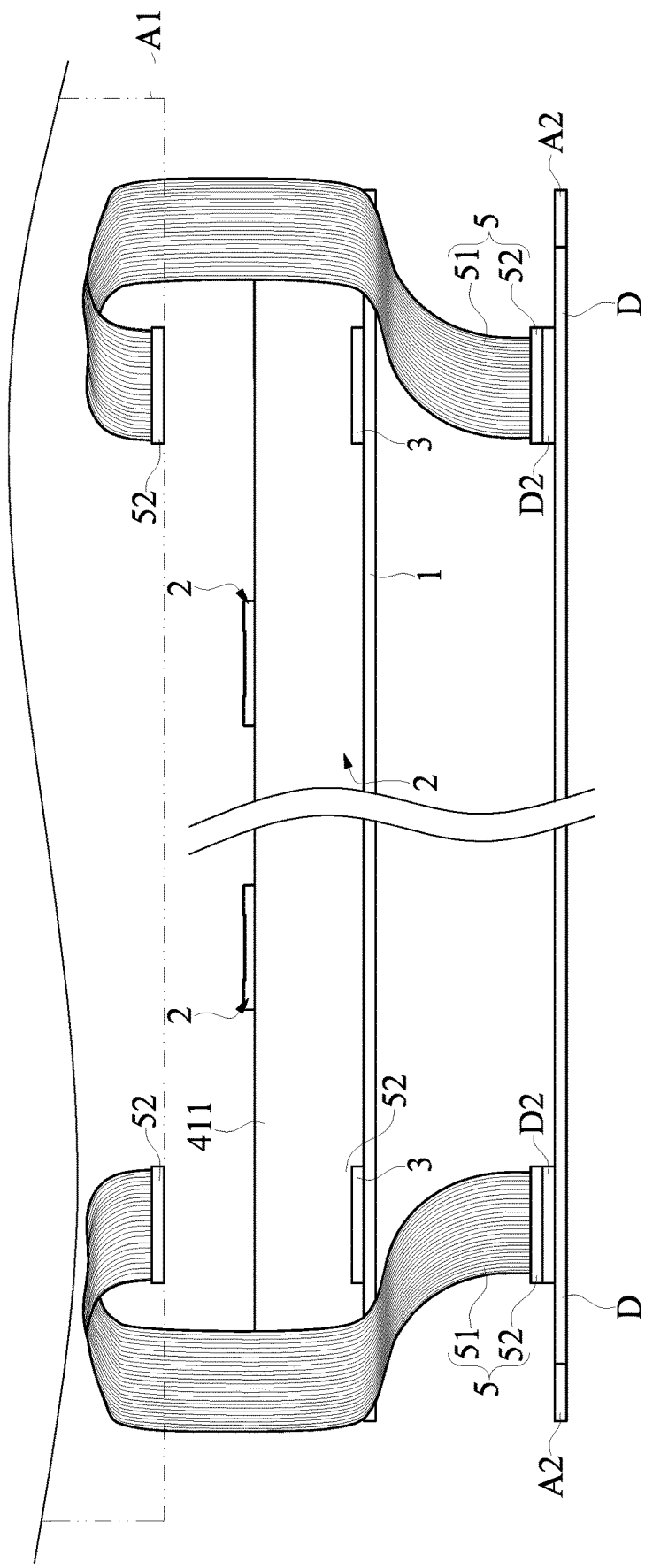
FIG. 22 is a side view of the system-level testing apparatus according to an embodiment of the present disclosure.
Figure 23:
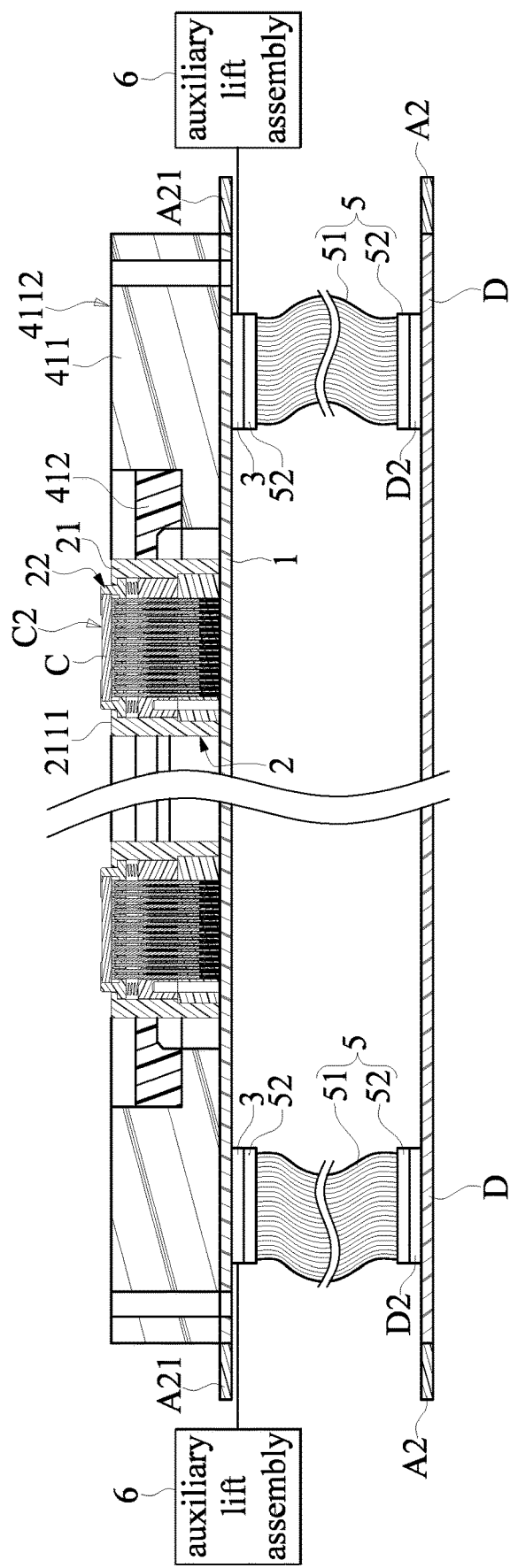
FIG. 23 is a side view of the system-level testing apparatus according to an embodiment of the present disclosure.

It should be noted that FIG. 21 to FIG. 23 show that each of the auxiliary connection members 5 includes the connection wires 51 and two connection ports 52, but the quantity of the connection wires 51 and the quantity of the connection ports 52 are not limited thereto. In other embodiments, the quantity of the connection port 52 included by each of the auxiliary connection members 5 can be one, and one end of each of the connection wires 51 can be directly connected to the corresponding one of the system connection structures D2 of the system circuit board D. In addition, the configuration of each of the auxiliary connection members 5 is not limited to that shown in FIG. 21 to FIG. 23.

When the system-level testing apparatus A is applied as an automation apparatus, the connection ports 52 of the auxiliary connection members 5 can be connected to the connection structures 3 of the carrying circuit board 1 through a robot arm. As shown in FIG. 21 to FIG. 23, the connection structures 3 and the electrical connection sockets 2 are disposed on the same side surface of the carrying circuit board 1, but the connection structures 3 are not limited to be disposed at the side surface of the carrying circuit board 1 where the electrical connection sockets 2 are disposed. In other embodiments, the connection structures 3 and the electrical connection sockets 2 can be disposed on two opposite side surfaces of the carrying circuit board 1.

Referring to FIG. 22, FIG. 22 is a side view of the system-level testing apparatus according to an embodiment of the present disclosure. The difference between the present embodiment and the previous embodiment is that the connection ports 52 of the auxiliary connection members 5 can be disposed on the apparatus body A1, each of the connection ports 52 is correspondingly arranged above the carrying circuit board 1, the carrying circuit board 1 is correspondingly disposed on a lift device, and the lift device can move the carrying circuit board 1 toward the connection ports 52. Therefore, the connection structures 3 of the carrying circuit board 1 can be connected to the connection ports 52. In a practical application, the connection ports 52 and the temperature adjusting device mentioned above can be jointly disposed on the apparatus body A1. Therefore, when the lift device allows the connection structures 3 of the carrying circuit board 1 and the connection ports 52 to be connected to each other, the temperature adjusting device can abut against the side surfaces of the chips carried by the electrical connection sockets 2 on the carrying circuit board 1 at the same time.

Referring to FIG. 23, FIG. 23 is a side view of the system-level testing apparatus according to an embodiment of the present disclosure. The difference between the present embodiment and the previous embodiment is that in addition to the auxiliary connection members 5, the system-level testing apparatus A can further include a plurality of auxiliary lift assemblies 6. The auxiliary lift assemblies 6 are connected to the connection ports 52 of the auxiliary connection members 5, and each of the auxiliary lift assemblies 6 is electrically connected to the control device A4. The control device A4 can control each of the auxiliary lift assemblies 6 to be operated, and each of the auxiliary lift assemblies 6 can allow the connection ports 52 connected thereto to be connected to or to be separated from one of the connection structures 3 of the carrying circuit board 1. In a practical application, each of the auxiliary lift assemblies 6 can be a slide rail, a cylinder, or a hydraulic cylinder, but the present disclosure is not limited thereto.

In a practical application, the connection structures 3 can be disposed at a side surface of the carrying circuit board 1 facing toward the system circuit board D, and the connection structures 3 can be correspondingly arranged at the side surface of the carrying circuit board 1 opposite to a side surface where the electrical connection sockets 2 are disposed, so that the auxiliary connection members 5 can facilitate the connection ports connected to the auxiliary connection members 5 to be easily connected to the connection structures 3 of the carrying circuit board 1. Therefore, as long as each of the auxiliary lift assemblies 6 vertically move the connection ports 52 connected thereto, the connection ports 52 and the connection structures 3 of the corresponding carrying circuit board 1 can be connected to each other.

In a practical application, the carrying circuit board 1 and the system circuit board D can be held in the corresponding one of the accommodating chambers A10 (as shown in FIG. 1) of the apparatus body A1 (as shown in FIG. 1) respectively through the holding structure A21 and the holding structure A2. After the carrying circuit board 1 and the system circuit board D are held in the apparatus body A1, the connection structures 3 of the carrying circuit board 1 are correspondingly arranged above the system connection structures D2 of the system circuit board D (the connection structures 3 are not in contact with the system connection structures D2).

Figure 24:
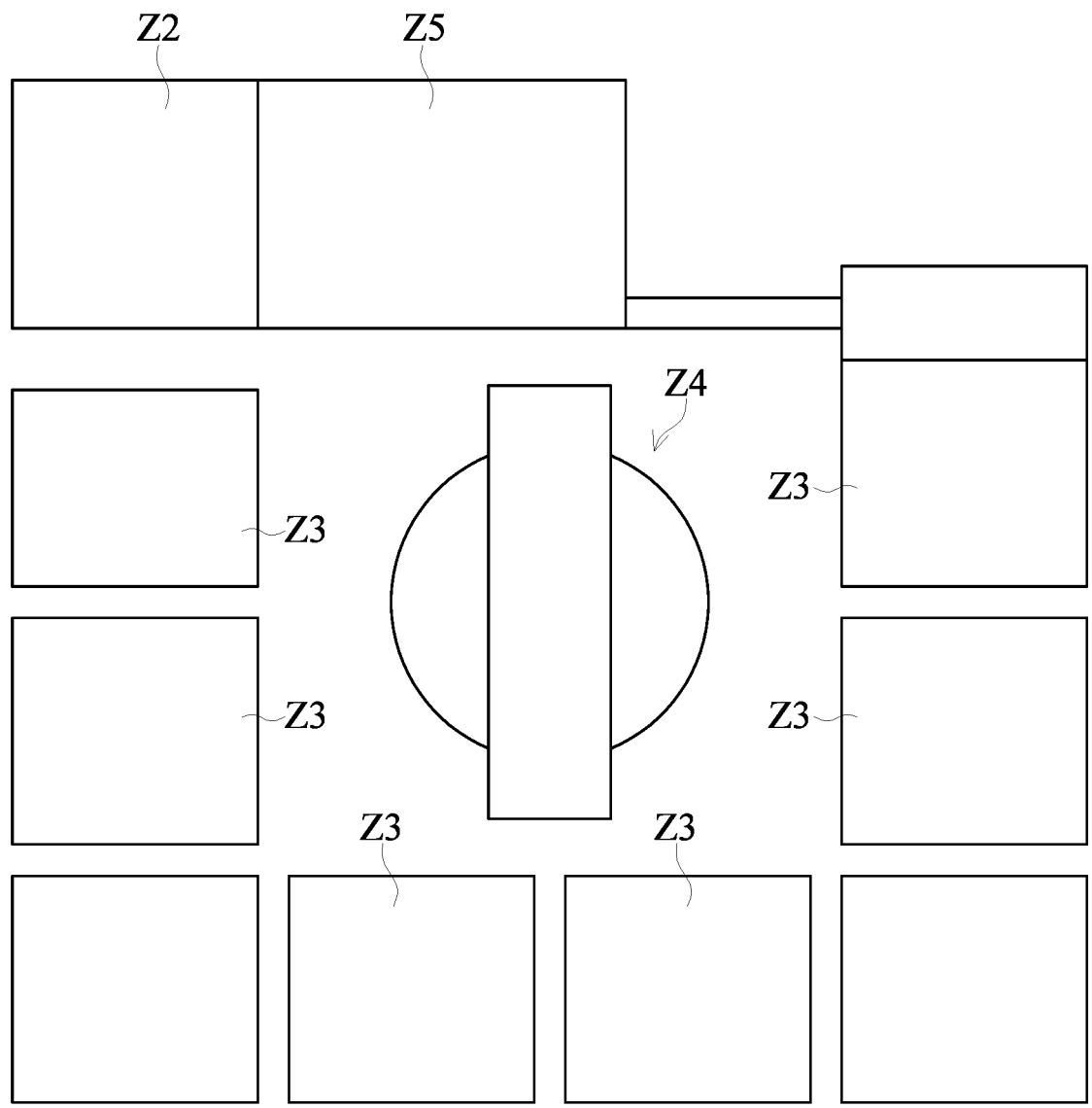
FIG. 24 is a schematic view of the system-level testing apparatus of the present disclosure.
Figure 25:
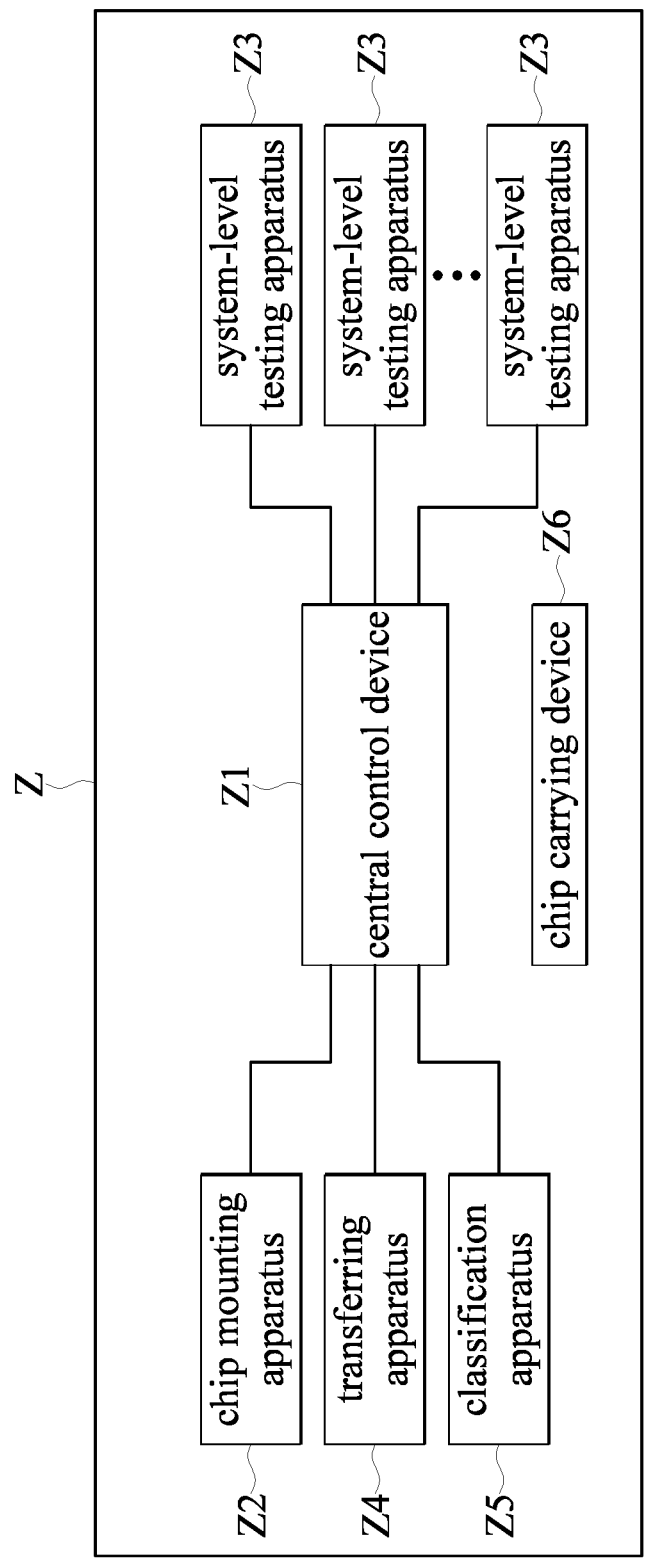
FIG. 25 is a block diagram of the system-level testing apparatus of the present disclosure.

Referring to FIG. 24 and FIG. 25, FIG. 24 is a schematic view of the system-level testing apparatus of the present disclosure, and FIG. 25 is a block diagram of the system-level testing apparatus of the present disclosure. The system-level testing system Z includes a central control device Z1, a chip mounting apparatus Z2, a plurality of system-level testing apparatuses Z3, a transferring apparatus Z4, a classification apparatus Z5, and a plurality of chip carrying devices Z6. The central control device Z1 can be various types of servers or computers. The system-level testing apparatuses Z3 and the chip carrying devices Z6 are respectively the same as the system-level testing apparatus A and the chip testing device A3 in the previous embodiments, and the components included by the system-level testing apparatuses Z3 and the chip carrying devices Z6 and the configuration thereof will not be reiterated herein. In addition, the components included by the system-level testing apparatus A and the chip carrying device A3 can be referred to in FIG. 1 to FIG. 3 and FIG. 7.

The central control device Z1 is electrically connected to the control device A4 (as shown in FIG. 2) of each of the system-level testing apparatuses Z3. The chip mounting device Z2 is configured to dispose the chips under test C onto the electrical connection sockets 2 (as shown in FIG. 3) of each of the chip carrying devices Z6. The transferring apparatus Z4 is configured to dispose the chip carrying devices Z6 carrying the chips under test C into the corresponding one of the accommodating chambers A10 (as shown in FIG. 1) of the system-level testing apparatus Z3. The classification apparatus Z5 is configured to transfer the chips under test C (as shown in FIG. 7) that have been performed with the system-level test operation to a good product region or a defective product region. In a practical application, the transferring apparatus Z4 is configured to transfer the system circuit board D.

A specific operation process of the system-level testing system Z of the present disclosure is described as follows. The central control device Z1 controls the chip mounting apparatus Z2 to mount the chips under test C onto the chip carrying devices Z6. The central control device Z1 controls the transferring device Z4 to dispose the system circuit board D into one of the accommodating chambers A10 of one of the system-level testing apparatuses Z3, and the central control device Z1 controls the corresponding one of the holding structures A2 to be operated through the control device A4 of the system-level testing apparatus Z3, so that the system circuit board D is fixed in the accommodating chamber A10. When the system circuit board D is fixed in the accommodating chamber A10, the central control device Z1 controls the transferring device Z4 to transfer the chip carrying device Z6 carrying the chips under test C to the accommodating chamber A10 with the system circuit board D disposed therein, and the central control device Z1 controls the transferring device Z4 to correspondingly dispose the chip carrying device Z6 onto the connection surface D1 of the system circuit board D.

After the chip carrying device Z6 is disposed on the system circuit board D, the control device A4 of the system-level testing apparatus Z3 performs the system-level test operation to the chips under test C carried by the chip carrying device Z6 and the system circuit board D. When the control device A4 performs the system-level test operation to the chips under test C connected to the system circuit board D, the control device A4 can control the temperature adjusting device A9 to be operated according a predetermined process so that the chips under test C are performed with the system-level test operation in an environment that has a predetermined temperature.

After the control device A4 finishes the system-level test operation to the chips under test C connected to the system circuit board, the control device A4 can transmit a related signal to the central control device Z1. After the central control device Z1 receives the related signal transmitted by the control device A4, the central control device Z1 can control the transferring device Z4 to transfer the chip carrying devices Z6 to the classification apparatus Z5, and the classification apparatus Z5 can perform a classification operation to the chips under test C according to a test result of each of the chips under test C in the system-level test operation.

In a practical application, the central control device Z1 can control the transferring apparatus Z4 to move the system circuit board D out of the system-level testing apparatus Z3, and then move another system circuit board D into the system-level testing apparatus Z3 according to different testing requirements.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A system-level testing apparatus configured to perform a system-level test operation to a plurality of chips under test and connected to a power supply apparatus, the system-level testing apparatus comprising:
    an apparatus body including at least one accommodating chamber;
    a holding structure disposed on the apparatus body, wherein the holding structure is arranged in the at least one accommodating chamber, and the holding structure is configured to hold a system circuit board;
    a chip carrying device movably disposed on a connection surface of the system circuit board held by the holding device, wherein the chip carrying device includes:
        a carrying circuit board having a first board surface and a second board surface respectively defined by two opposite sides of the carrying circuit board;
        a plurality of electrical connection sockets disposed on the first board surface, wherein each of the electrical connection sockets is configured to carry one of the chips under test; and
        a plurality of connection structures disposed on the first board surface or the second board surface, wherein the connection structures are electrically connected to the electrical connection sockets, and wherein the connection structures are configured to be connected to a plurality of system connection structures disposed on the connection surface of the system circuit board; and
    a control device electrically connected to the chip carrying device,
    wherein, when the chip carrying device is disposed in the at least one accommodating chamber and at least one of the electrical connection sockets of the chip carrying device carries at least one of the chips under test, the system circuit board is held by the holding structure, and the connection structures are connected to the system connection structures, and wherein, when the system-level testing apparatus is provided with electricity by the power supply apparatus, the at least one of the chips under test carried by at least one of the electrical connection sockets is electrically connected to the system circuit board through the at least one of the electrical connection sockets, at least one of the connection structures, and at least one of the system connection structures, and the control device is configured to transmit at least one test signal to the chip carrying device to test whether the at least one of the chips under test carried by the at least one of the electrical connection sockets normally works after the at least one of the chips under test is electrically connected to the system circuit board.

2. The system-level testing apparatus according to claim 1, wherein each of the electrical connection sockets has a plurality of probe assemblies, a part of each of the probe assemblies is exposed from one end of the corresponding one of the electrical connection sockets, the first board surface of the carrying circuit board has a plurality of electrical contacting structures, and the electrical connection structures are configured to be connected to the probe assemblies, wherein the chip carrying device further includes a fixing assembly, the fixing assembly includes at least one fixing member and a plurality of screwing members, the at least one fixing member includes a plurality of thru-holes, and each of the thru-holes is configured to be penetrated by a part of at least one of the electrical connection sockets, and wherein the at least one fixing member is fixed onto the first board surface of the carrying circuit board through the screwing members, and the electrical connection sockets are jointly held by the at least one fixing member and the carrying circuit board to be fixed onto the first board surface so that each of the electrical connection sockets is detachably disposed on the first board surface.

3. The system-level testing apparatus according to claim 1, further comprising a pressing device, the control device is electrically connected to the pressing device, and the control device is configured to control the pressing device to press on a side surface of the chips under test disposed on the electrical connection sockets by a contacting structure of the pressing device, wherein, when the chips under test disposed on the electrical connection sockets are pressed by the pressing device, a plurality of contact structures of the chips under test are in contact with one end of a plurality of probe assemblies of the electrical connection sockets so that the chips under test are configured to be electrically connected to at least one of the connection structures through the electrical connection sockets.

4. The system-level testing apparatus according to claim 3, wherein each of the electrical connection sockets includes:
    a socket body having a top wall and an annular wall, wherein the top wall has an opening, one end of the annular wall is connected to a peripheral edge of the top wall, and another end of the annular wall is abutted against the carrying circuit board, and wherein the top wall, the annular wall, and the circuit board jointly define an accommodating slot, the top wall has an outer surface and an inner surface respectively defined by two opposite sides thereof, the inner surface is arranged in the accommodating slot, and one side of the top wall opposite to the carrying circuit board is defined as the outer surface;
    a supporting structure abutted against the carrying circuit board and arranged in the accommodating slot;
    a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips under test, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and the probe assemblies fixed to the supporting structure through one end of the probe assemblies, wherein a part of each of the probe assemblies is exposed from the supporting structure, and another end of the probe assemblies penetrates through the connection holes;

wherein, in each of the electrical connection sockets, when the chip receiving slot receives the corresponding chip under test, and the retaining portions are not pressed by the contacting structure, the probe assemblies in the connection holes are not in contact with the contact structures of the corresponding chips under test, and a part of the lift structure protrudes from the outer surface of the top wall, and wherein, in each of the electrical connection sockets, when the chip receiving slot receives the corresponding chip under test, and the retaining portions are pressed to move into the socket body by the contacting structure, and the probe assemblies in the connection holes are connected to the contact structures of the corresponding chip under test.

5. The system-level testing apparatus according to claim 3, wherein the contacting structure includes a contacting surface, when the pressing device presses on the retaining portions of the electrical connection sockets, the contacting surface is correspondingly abutted against a side surface of each of the chips under test carried by the corresponding one of the electrical connection sockets, wherein the contacting structure includes at least one fluid channel inside thereof, a fluid entrance, and a fluid exit, and two ends of the at least one fluid channel are respectively defined as the fluid entrance and the fluid exit, and wherein, when a high-temperature fluid or a low-temperature fluid flows into the at least one fluid channel through the fluid entrance, a temperature of the contacting surface is accordingly increased or decreased.

6. The system-level testing apparatus according to claim 5, wherein the system-level testing apparatus is connected to an air suction device, and the system-level testing apparatus further includes a cover connected to the contacting structure, wherein, when the contacting surface of the contacting structure is in contact with the side surfaces of the chips under test carried by the electrical connection sockets, the cover and the carrying circuit board jointly define an enclosed space, and wherein the control device is configured to control the air suction device to suction away air in the enclosed space.

7. The system-level testing apparatus according to claim 1, further comprising a temperature adjusting device disposed on the apparatus body, wherein the temperature adjusting device includes:

at least one temperature adjuster; and at least one contacting structure having a contacting surface, wherein the contacting surface is configured to be in contact with a side surface of each of the chips under test carried by the chip carrying device, and wherein the control device is configured to control the at least one temperature adjuster so that a temperature of the contacting structure is increased to a predetermined high temperature or decreased to a predetermined low temperature.

8. The system-level testing apparatus according to claim 7, wherein each of the electrical connection sockets includes:

a socket body having a top wall and an annular wall, wherein the top wall has an opening, one end of the annular wall is connected to a peripheral edge of the top wall, and another end of the annular wall is abutted against the carrying circuit board, and wherein the top wall, the annular wall, and the circuit board jointly define an accommodating slot, the top wall has an outer surface and an inner surface respectively defined by two opposite sides thereof, the inner surface is arranged in the accommodating slot, and one side of the top wall opposite to the carrying circuit board is defined as the outer surface;

a supporting structure abutted against the carrying circuit board and arranged in the accommodating slot;

a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips under test, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and a plurality of probe assemblies connected to the supporting structure through one end of the probe assemblies, wherein a part of each of the probe assemblies is exposed from the supporting structure, and another end of the probe assemblies penetrates through the connection holes;

wherein, in each of the electrical connection sockets, when the chip receiving slot receives the corresponding chip under test, and the retaining portions are not pressed by the contacting structure, the probe assemblies in the connection holes are not in contact with a plurality of contact structures of the corresponding chips under test, and a part of the lift structure protrudes from the outer surface of the top wall, and wherein, in each of the electrical connection sockets, when the chip receiving slot receives the corresponding chip under test, and the retaining portions are pressed to move into the socket body by the contacting structure, the probe assemblies in the connection holes are connected to the contact structures of the corresponding chip under test.

9. The system-level testing apparatus according to claim 7, wherein the chip carrying device further includes a fixing assembly, the fixing assembly includes at least one fixing member and a plurality of screwing members, the at least one fixing member includes a plurality of thru-holes, and each of the thru-holes is configured to be penetrated by a part of at least one of the electrical connection sockets, wherein the at least one fixing member is fixed onto the first board surface of the carrying circuit board through the screwing members, and the electrical connection sockets are jointly held by the at least one fixing member and the carrying circuit board to be fixed onto the first board surface, and wherein the system-level testing apparatus is connected to an air suction device, and the temperature adjusting device further includes:
 a frame body surrounding the contacting structure, wherein the frame body includes an annular abutting surface, and wherein the annular abutting surface is flush with the contacting surface, or the contacting surface is higher than the annular abutting surface; and
 an elastic annular enclosed member disposed on the annular abutting surface;
 wherein, when the contacting surface is in contact with the side surfaces of the chips under test carried by the chip carrying device, the elastic annular enclosed member is correspondingly abutted against one side of the at least one fixing member opposite to the carrying circuit board, and the contacting structure and the carrying circuit board jointly define an enclosed space there-between; and
 wherein the control device is configured to control the air suction device to suction away air in the enclosed space.

10. The system-level testing apparatus according to claim 9, wherein the frame body and the contacting structure jointly define at least one air suction gap there-between, the frame body includes at least one air suction hole in spatial communication with the at least one air suction gap, and the air suction device is configured to suction away air in the enclosed space through the at least one air suction hole and the at least one air suction gap.

11. The system-level testing apparatus according to claim 1, further comprising at least one first power supply member and at least one second power supply member, the at least one first power supply member is disposed on the carrying circuit board surface, and the at least one second power supply member is disposed on the apparatus body, wherein the apparatus body includes at least one accommodating chamber, and the holding structure is disposed in the at least one accommodating chamber, and wherein, when the system circuit board is held in the at least one accommodating chamber by the holding structure, and the carrying circuit board is disposed on the connection surface of the system circuit board, the power supply apparatus is configured to provide electricity for each of the chips under test and the system circuit board to be operated through the at least one first power supply member and the at least one second power supply member.

12. The system-level testing apparatus according to claim 1, wherein the apparatus body includes at least one accommodating chamber, the system-level testing apparatus further includes at least one lift device disposed in the at least one accommodating chamber, and the control device is electrically connected to the at least one lift device, and wherein the control device is configured to control the at least one lift device to push the chip carrying device or the system circuit board so that the carrying circuit board is abutted against the connection surface of the system circuit board.

13. The system-level testing apparatus according to claim 1, further comprising a plurality of auxiliary connection members, each of the auxiliary connection members includes at least one connection wire and a connection port, one end of at least one connection wire is connected to the connection port, another end of the at least one connection wire is connected to one of the system connection structures of the system circuit board, and the connection ports are configured to be connected to the connection structures, wherein the system-level testing apparatus further includes a plurality of auxiliary lift assemblies, each of the auxiliary lift assemblies is electrically connected to the control device, the auxiliary lift assemblies are connected to the connection ports, and the control device is configured to control each of the auxiliary lift assemblies so that the corresponding one of the connection ports connected by the corresponding one of the auxiliary lift assemblies is connected to or separated from one of the connection structures.

14. A system-level testing system configured to perform a system-level test operation to a plurality of chips under test and connected to a power supply apparatus, the system-level testing system comprising:
 a central control device;
 a plurality of system-level testing apparatuses each electrically connected to the central control device, wherein each of the system-level testing apparatuses includes:
  an apparatus body including at least one accommodating chamber; and
  a holding structure disposed on the apparatus body, wherein the holding structure is arranged in the at least one accommodating chamber and is configured to hold a system circuit board;
 a plurality of chip carrying devices each includes:
  a carrying circuit board having a first board surface and a second board surface respectively defined by two opposite sides of the carrying circuit board;
  a plurality of electrical connection sockets disposed on the first board surface, wherein each of the electrical connection sockets is configured to carry one of the chips under test; and
  a plurality of connection structures disposed on the first board surface or the second board surface, wherein the connection structures are electrically connected to the electrical connection sockets, and wherein the connection structures are configured to be connected to a plurality of system connection structures disposed on a connection surface of the system circuit board;
 a chip mounting apparatus electrically connected to the central control device, wherein the central control device is configured to control the chip mounting apparatus to mount the chips under test onto the electrical connection sockets; and
 a transferring apparatus electrically connected to the central control device, wherein the central control device is configured to control the transferring device to move one of the system circuit boards into or out of the at least one accommodating chamber, and wherein the central control device is configured to control the transferring device to move one of the chip carrying devices into or out of the at least one accommodating chamber;

wherein, when the chip carrying device is disposed in the at least one accommodating chamber and at least one of the electrical connection sockets of the chip carrying device carries at least one of the chips under test, the system circuit board is held by the holding structure, and the connection structures are connected to the system connection structures, and wherein, when the system-level testing apparatus is provided with electricity by the power supply apparatus, the at least one of the chips under test carried by at least one of the electrical connection sockets is electrically connected to the system circuit board through the at least one of electrical connection sockets, at least one of the connection structures, and at least one of the system connection structures, and the central control device is configured to transmit at least one test signal to the chip carrying device to test whether the at least one of the chips under test carried by the at least one of the electrical connection sockets works normally after the at least one of the chips under test is electrically connected to the system circuit board.

15. The system-level testing system according to claim 14, wherein each of the system-level testing apparatuses further includes a pressing structure, the control device is electrically connected to the pressing device, and the control device is configured to control the pressing device to press on a side surface of the chips under test disposed on the electrical connection sockets by a contacting structure of the pressing device, wherein, when the chips under test disposed on the electrical connection sockets are pressed by the pressing device, a plurality of contact structures of the chips under test are in contact with one end of a plurality of probe assemblies of the electrical connection sockets so that the chips under test are configured to be electrically connected to at least one of the connection structures through the electrical connection sockets, and wherein the electrical connection socket of each of the system-level testing apparatuses includes:

a socket body having a top wall and an annular wall, wherein the top wall has an opening, one end of the annular wall is connected to a peripheral edge of the top wall, and another end of the annular wall is abutted against the carrying circuit board, and wherein the top wall, the annular wall, and the circuit board jointly define an accommodating slot, the top wall has an outer surface and an inner surface respectively defined by two opposite sides thereof, the inner surface is arranged in the accommodating slot, and one side of the top wall opposite to the carrying circuit board is defined as the outer surface;

a supporting structure abutted against the carrying circuit board and arranged in the accommodating slot;

a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips under test, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and the probe assemblies fixed to the supporting structure through one end of the probe assemblies, wherein a part of each of the probe assemblies is exposed from the supporting structure, and another end of the probe assemblies penetrates through the connection holes;

wherein, in each of the electrical connection sockets, when the chip receiving slot receives the corresponding chip under test, and the retaining portions are not pressed by the contacting structure, the probe assemblies in the connection holes are not in contact with the contact structures of the corresponding chips under test, and a part of the lift structure protrudes from the outer surface of the top wall, and wherein, in each of the electrical connection sockets, when the chip receiving slot receives the corresponding chip under test, the retaining portions are pressed to move into the socket body by the contacting structure, and the probe assemblies in the connection holes are connected to the contact structures of the corresponding chip under test.

16. The system-level testing system according to claim 14, wherein each of the system-level testing apparatuses further includes a pressing device, the control device is electrically connected to the pressing device, and the control device is configured to control the pressing device to press on a side surface of the chips under test disposed on the electrical connection sockets by a contacting structure of the pressing device, wherein, when the chips under test disposed on the electrical connection sockets are pressed by the pressing device, a plurality of contact structures of the chips under test are in contact with one end of a plurality of probe assemblies of the electrical connection sockets so that the chips under test are configured to be electrically connected to at least one of the connection structures through the electrical connection sockets, wherein the contacting structure includes a contacting surface, when the pressing device presses on the retaining portions of the electrical connection sockets, the contacting surface is correspondingly abutted against a side surface of each of the chips under test carried by the corresponding one of the electrical connection sockets, wherein the contacting structure includes at least one fluid channel inside thereof, a fluid entrance, and a fluid exit, and two ends of the at least one fluid channel are respectively defined as the fluid entrance and the fluid exit, wherein, when a high-temperature fluid or a low-temperature fluid flows into the at least one fluid channel through the fluid entrance, a temperature of the contacting surface is accordingly increased or decreased, wherein each of the system-level testing apparatuses is connected to an air suction device, each of the system-level testing apparatuses further includes a cover connected to the contacting structure, wherein, when the contacting surface of the contacting structure is in contact with the side surfaces of the chips under test carried by the electrical connection sockets, the cover and the carrying circuit board jointly define an enclosed space, and wherein the control device is configured to control the air suction device to suction away air in the enclosed space.

17. The system-level testing system according to claim 14, wherein each of the system-level testing apparatuses further includes a temperature adjusting device disposed on the apparatus body, the temperature adjusting device includes:
   at least one temperature adjuster; and
   at least one contacting structure having a contacting surface, wherein the contacting surface is configured to be in contact with a side surface of each of the chips under test carried by the chip carrying device, and wherein the control device is configured to control the at least one temperature adjuster so that a temperature of the contacting structure is increased to a predetermined high temperature or decreased to a predetermined low temperature;
   wherein each of the electrical connection sockets of the system-level testing apparatuses includes:
      a socket body having a top wall and an annular wall, wherein the top wall has an opening, one end of the annular wall is connected to a peripheral edge of the top wall, and another end of the annular wall is abutted against the carrying circuit board, and wherein the top wall, the annular wall, and the circuit board jointly define an accommodating slot, the top wall has an outer surface and an inner surface respectively defined by two opposite sides thereof, the inner surface is arranged in the accommodating slot, and one side of the top wall opposite to the carrying circuit board is defined as the outer surface;
      a supporting structure abutted against the carrying circuit board and arranged in the accommodating slot;
      a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips under test, and wherein the lift structure has a plurality of connection holes penetrating through the base portion and the carrying portion;
      at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and
      a plurality of probe assemblies fixed to the supporting structure through one end of the probe assemblies, wherein a part of each of the probe assemblies is exposed from the supporting structure, and another end of the probe assemblies penetrates through the connection holes;
   wherein, in each of the electrical connection sockets, when the chip receiving slot receives the corresponding chip under test, and the retaining portions are not pressed by the contacting structure, the probe assemblies in the connection holes are not in contact with the contact structures of the corresponding chips under test, and a part of the lift structure protrudes from the outer surface of the top wall, and
   wherein, in each of the electrical connection sockets, when the chip receiving slot receives the corresponding chip under test, the retaining portions are pressed to move into the socket body by the contacting structure, and the probe assemblies in the connection holes are connected to the contact structures of the corresponding chip under test.

18. The system-level testing system according to claim 17, wherein each of the chip carrying devices further includes a fixing assembly, the fixing assembly includes at least one fixing member and a plurality of screwing members, the at least one fixing member includes a plurality of thru-holes, and each of the thru-holes is configured to be penetrated by a part of at least one of the electrical connection sockets, wherein the at least one fixing member is fixed onto the first board surface of the carrying circuit board through the screwing members, and the electrical connection sockets are jointly held by the at least one fixing member and the carrying circuit board to be fixed onto the first board surface, wherein the system-level testing apparatus is connected to an air suction device, and wherein the temperature adjusting device further includes:
   a frame body surrounding the contacting structure, wherein the frame body includes an annular abutting surface, and wherein the annular abutting surface is flush with the contacting surface, or the contacting surface is higher than the annular abutting surface; and
   an elastic annular enclosed member disposed on the annular abutting surface;
   wherein, when the contacting surface is in contact with the side surfaces of the chips under test carried by the chip carrying device, the elastic annular enclosed member is correspondingly abutted against one side of the at least one fixing member opposite to the carrying circuit board, and the contacting structure and the carrying circuit board jointly define an enclosed space therebetween,
   wherein the control device is configured to control the air suction device to suction away air in the enclosed space, and
   wherein the frame body and the contacting structure jointly define at least one air suction gap there-between, the frame body includes at least one air suction hole in spatial communication with the at least one air suction gap, and the air suction device is configured to suction away air in the enclosed space through the at least one air suction hole and the at least one air suction gap.

19. The system-level testing system according to claim 14, wherein each of the system-level testing apparatuses further includes at least one first power supply member and at least one second power supply member, the at least one first power supply member is disposed on the carrying board surface, and the at least one second power supply member is disposed on the apparatus body, wherein the apparatus body includes at least one accommodating chamber, and the holding structure is disposed in the at least one accommodating chamber, wherein, when the system circuit board is held in the at least one accommodating chamber by the holding structure, and the carrying circuit board is disposed on the connection surface of the system circuit board, the power supply apparatus is configured to provide electricity for each of the chips under test and the system circuit board to be operated through the at least one first power supply member and the at least one second power supply member, wherein the apparatus body includes at least one accommodating chamber, the system-level testing apparatus further includes at least one lift device disposed in the at least one accommodating chamber, and the control device is electrically connected to the at least one lift device, and wherein the control device is configured to control the at least one lift device to push the chip carrying device or the system circuit board so that the carrying circuit board is abutted against the connection surface of the system circuit board.

20. The system-level testing system according to claim 14, wherein the system-level testing apparatus further includes a plurality of auxiliary connection members, each of the auxiliary connection members includes at least one connection wire and a connection port, one end of at least one connection wire is connected to the connection port, another end of the at least one connection wire is connected to one of the system connection structures of the system circuit board, and the connection ports are configured to be connected to the connection structures, and wherein the system-level testing system further includes a plurality of auxiliary lift assemblies, each of the auxiliary lift assemblies is electrically connected to the control device, the auxiliary lift assemblies are connected to the connection ports, and the control device is configured to control each of the auxiliary lift assemblies so that the corresponding one of the connection ports connected by the corresponding one of the auxiliary lift assemblies is connected to or separated from one of the connection structures.

\* \* \* \* \*